(12) United States Patent
Kitano

(10) Patent No.: US 12,707,750 B2
(45) Date of Patent: Aug. 11, 2026

(54) IMAGING ELEMENT AND ELECTRONIC APPARATUS

(71) Applicant: SONY SEMICONDUCTOR SOLUTIONS CORPORATION, Kanagawa (JP)

(72) Inventor: Yoshiaki Kitano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 428 days.

(21) Appl. No.: 18/566,947

(22) PCT Filed: May 12, 2022

(86) PCT No.: PCT/JP2022/020012
§ 371 (c)(1),
(2) Date: Dec. 4, 2023

(87) PCT Pub. No.: WO2022/264718
PCT Pub. Date: Dec. 22, 2022

(65) Prior Publication Data

US 2024/0274640 A1 Aug. 15, 2024

(30) Foreign Application Priority Data

Jun. 15, 2021 (JP) ................................ 2021-099196

(51) Int. Cl.
*H10F 39/00* (2025.01)
*H10F 39/18* (2025.01)
*H10W 20/40* (2026.01)

(52) U.S. Cl.
CPC ......... *H10F 39/811* (2025.01); *H10F 39/182* (2025.01); *H10F 39/807* (2025.01); *H10F 39/809* (2025.01); *H10W 20/496* (2026.01)

(58) Field of Classification Search
CPC .......................... H10F 39/811; H10F 39/8027
See application file for complete search history.

(56) References Cited

U.S. PATENT DOCUMENTS

2005/0168608 A1 8/2005 Fossum
2009/0045319 A1 2/2009 Sugawa
(Continued)

FOREIGN PATENT DOCUMENTS

CN 107240593 A 10/2020
CN 112054032 A 12/2020
(Continued)

OTHER PUBLICATIONS

International Search Report and Written Opinion prepared by the Japan Patent Office on Jun. 30, 2022, for International Application No. PCT/JP2022/020012, 2 pgs.

*Primary Examiner* — Yu-Hsi D Sun
(74) *Attorney, Agent, or Firm* — SHERIDAN ROSS P.C.

(57) ABSTRACT

The present technology relates to an imaging element and an electronic apparatus configured to enable expansion of the dynamic range of a photodiode. Included are a photoelectric conversion section configured to convert light into a charge, three or more accumulation sections configured to temporarily accumulate the charge, a transfer section configured to transfer the charge from the photoelectric conversion section to the accumulation sections, and a conversion efficiency switching section configured to control a conduction state between the accumulation sections. At least two accumulation sections of the three or more accumulation sections are each a capacitive element, and the three or more accumulation sections each accumulate an overflow charge from the photoelectric conversion section. The present technology can be applied to an imaging element configured to capture an image, for example.

17 Claims, 20 Drawing Sheets

(56) References Cited

U.S. PATENT DOCUMENTS

| | | | | |
|---|---|---|---|---|
| 2010/0097508 | A1* | 4/2010 | Yanagita | H04N 25/621 348/301 |
| 2011/0211103 | A1 | 9/2011 | Sakano | |
| 2013/0001403 | A1 | 1/2013 | Yamakawa | |
| 2013/0334403 | A1 | 12/2013 | Kozlowski | |
| 2018/0098007 | A1 | 4/2018 | Sano et al. | |
| 2019/0222787 | A1 | 7/2019 | Hirata | |
| 2019/0319061 | A1 | 10/2019 | Liu et al. | |
| 2020/0186732 | A1* | 6/2020 | Takizawa | H04N 25/77 |
| 2022/0070396 | A1* | 3/2022 | Amikawa | H04N 25/60 |

FOREIGN PATENT DOCUMENTS

| | | | |
|---|---|---|---|
| JP | 2006-245522 | | 9/2006 |
| JP | 2013-033896 | | 2/2013 |
| JP | 2020047734 | A | 3/2020 |
| KR | 20110098624 | A | 9/2011 |
| KR | 20130007444 | A | 1/2013 |
| KR | 20170136494 | A | 12/2017 |
| WO | WO 2016/163240 | | 10/2016 |
| WO | WO-2017169480 | A1 | 10/2017 |
| WO | WO 2017/199526 | | 11/2017 |
| WO | WO 2020/059335 | | 3/2020 |
| WO | WO-2021100332 | A1 | 5/2021 |

* cited by examiner t1
RESET
t2
EXPOSURE PERIOD
t3
MCG RESET PERIOD
t4
HCG RESET PERIOD
t5
HCG READOUT PERIOD
t6
MCG READOUT PERIOD
t7
LCG READOUT PERIOD
t8
LCG RESET PERIOD
PD
TG
FD
FDG
MIM1
FCG
MIM2
RST
VDD S11
52
53
51
150
S12
54
59
150
S13
55
160
150
S14
130
160
150
S15
150
160
130
S21
130
S22
57
130

1000
1001
LENS GROUP
1002
IMAGING ELEMENT
1003
DSP CIRCUIT
1004
FRAME MEMORY
1005
DISPLAY UNIT
1006
RECORDING UNIT
1007
OPERATION UNIT
1008
POWER SUPPLY UNIT
1009

IMAGING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2022/020012, having an international filing date of 12 May 2022, which designated the United States, which PCT application claimed the benefit of Japanese Patent Application No. 2021-099196, filed 15 Jun. 2021, the entire disclosures of each of which are incorporated herein by reference.

TECHNICAL FIELD

The present technology relates to an imaging element and an electronic apparatus, and relates to, for example, an imaging element and an electronic apparatus configured to enable dynamic range expansion and higher-quality image obtainment.

BACKGROUND ART

In general, imaging elements such as CMOS (Complementary Metal Oxide Semiconductor) image sensors and CCDs (Charge Coupled Devices) are widely used in digital still cameras, digital video cameras, and the like. The enhancement of the characteristics of imaging elements is demanded, and, for example, dynamic range expansion is demanded. In PTL 1, a plurality of storage capacitive elements configured to accumulate overflow charges from photodiodes are included, and accordingly, achieving dynamic range expansion is proposed.

CITATION LIST

Patent Literature

PTL 1: Japanese Patent Laid-open No. 2006-245522

SUMMARY

Technical Problem

In order to allow overflow charges from a photodiode to be accumulated in a storage capacitive element, it is necessary to set an overflow barrier of a transfer transistor configured to transfer charges from the photodiode to a low level. In such a case, there is a possibility that the Qs (saturation charge amount) of the photodiode decreases. It is demanded to enable dynamic range expansion without a decrease in the saturation charge amounts of photodiodes.

The present technology has been made in view of such circumstances and enables dynamic range expansion.

Solution to Problem

A first imaging element according to one aspect of the present technology is an imaging element including a photoelectric conversion section configured to convert light into a charge, three or more accumulation sections configured to temporarily accumulate the charge, a transfer section configured to transfer the charge from the photoelectric conversion section to the accumulation sections, and a conversion efficiency switching section configured to control a conduction state between the accumulation sections, in which at least two accumulation sections of the three or more accumulation sections are each a capacitive element, and the three or more accumulation sections accumulate an overflow charge from the photoelectric conversion section.

A second imaging element according to one aspect of the present technology is an imaging element including a photoelectric conversion section, a transfer transistor connected to the photoelectric conversion section, a floating diffusion connected to the transfer transistor, a first conversion efficiency switching transistor connected to the floating diffusion, a second conversion efficiency switching transistor connected to the first conversion efficiency switching transistor, a reset transistor connected to the second conversion efficiency switching transistor, a first accumulation section, and a second accumulation section, in which the first accumulation section is connected between the first conversion efficiency switching transistor and the second conversion efficiency switching transistor, the second accumulation section is connected between the second conversion efficiency switching transistor and the reset transistor, and the floating diffusion accumulates a charge that has overflowed from the photoelectric conversion section.

An electronic apparatus according to one aspect of the present technology is an electronic apparatus including an imaging element including a photoelectric conversion section configured to convert light into a charge, three or more accumulation sections configured to temporarily accumulate the charge, a transfer section configured to transfer the charge from the photoelectric conversion section to the accumulation sections, a conversion efficiency switching section configured to control a conduction state between the accumulation sections, at least two accumulation sections of the three or more accumulation sections are each a capacitive element, and the three or more accumulation sections each accumulating an overflow charge from the photoelectric conversion section, and a processing unit configured to process a signal from the imaging element.

The first imaging element according to the one aspect of the present technology includes the photoelectric conversion section configured to convert light into a charge, the three or more accumulation sections configured to temporarily accumulate the charge, the transfer section configured to transfer the charge from the photoelectric conversion section to the accumulation sections, and the conversion efficiency switching section configured to control a conduction state between the accumulation sections. At least two accumulation sections of the three or more accumulation sections are each a capacitive element, and the three or more accumulation sections accumulate an overflow charge from the photoelectric conversion section.

The second imaging element according to the one aspect of the present technology includes the photoelectric conversion section, the transfer transistor connected to the photoelectric conversion section, the floating diffusion connected to the transfer transistor, the first conversion efficiency switching transistor connected to the floating diffusion, the second conversion efficiency switching transistor connected to the first conversion efficiency switching transistor, the reset transistor connected to the second conversion efficiency switching transistor, the first accumulation section, and the second accumulation section. The first accumulation section is connected between the first conversion efficiency switching transistor and the second conversion efficiency switching transistor, the second accumulation section is connected between the second conversion efficiency switching transistor and the reset transistor, and the floating diffusion accumulates a charge that has overflowed from the photoelectric conversion section.

The electronic apparatus according to the one aspect of the present technology is configured to include the first imaging element.

Note that the electronic apparatus may be an independent apparatus or an internal block forming a single apparatus.

DESCRIPTION OF EMBODIMENTS

Now, modes for carrying out the present technology (hereinafter referred to as an "embodiment") are described.

Example of Configuration of Imaging Device

Figure 1:
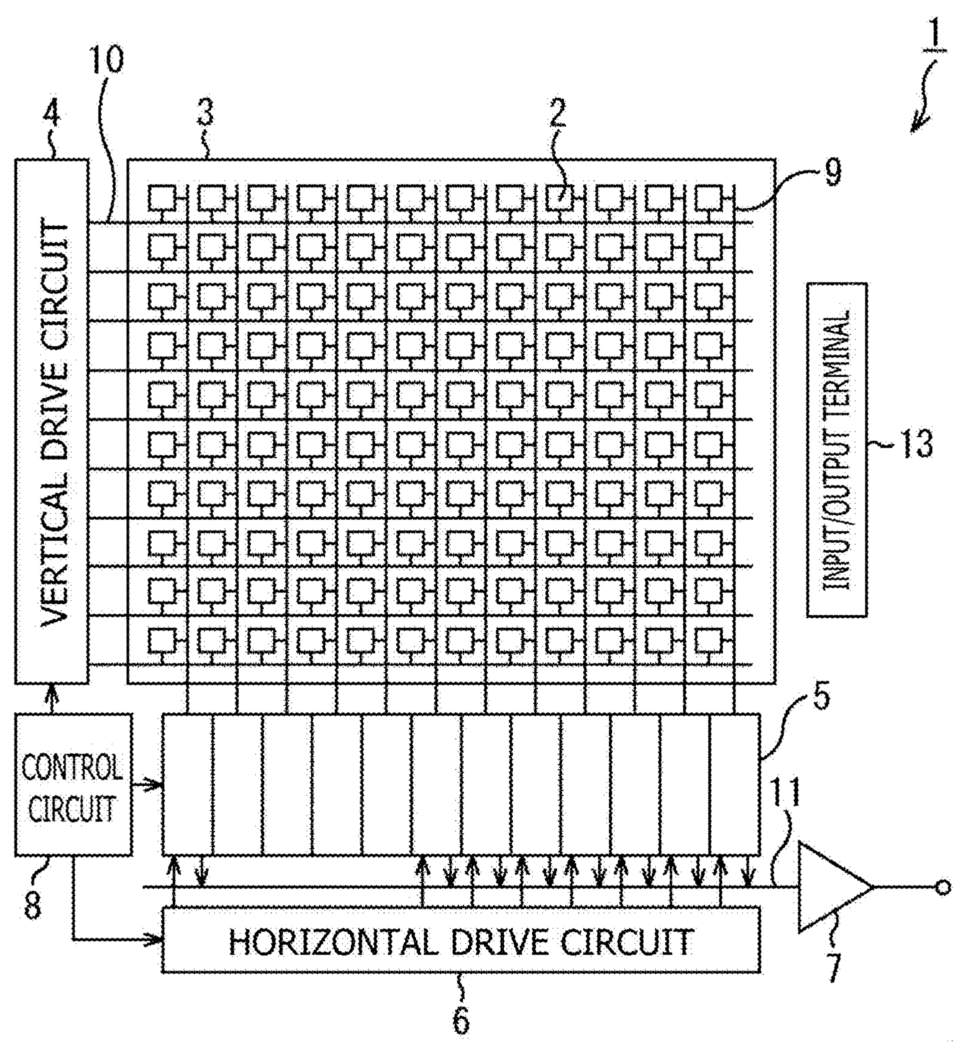
FIG. 1 is a diagram depicting an example of a configuration of an imaging device of an embodiment to which the present technology is applied.

FIG. 1 depicts an example of a configuration of an imaging device in an embodiment to which the present technology is applied.

An imaging device 1 of FIG. 1 includes a pixel array section 3 in which pixels 2 are arranged in a two-dimensional array, and a peripheral circuit section around the pixel array section 3. The peripheral circuit section includes a vertical drive circuit 4, column signal processing circuits 5, a horizontal drive circuit 6, an output circuit 7, a control circuit 8, and the like.

The pixel 2 includes a photodiode which serves as a photoelectric conversion element, and a plurality of pixel transistors. The plurality of pixel transistors are MOS transistors and include, for example, a transfer transistor, a selection transistor, a reset transistor, an amplification transistor, and the like.

The control circuit 8 receives input clocks and data on operation mode instructions and the like and outputs data such as internal information regarding the imaging device 1. That is, on the basis of a vertical synchronization signal, a horizontal synchronization signal, and a master clock, the control circuit 8 generates a clock signal and a control signal, on the basis of which the vertical drive circuit 4, the column signal processing circuits 5, the horizontal drive circuit 6, and the like operate. The control circuit 8 outputs the generated clock signal and control signal to the vertical drive circuit 4, the column signal processing circuits 5, the horizontal drive circuit 6, and the like.

The vertical drive circuit 4 includes a shift register, for example. The vertical drive circuit 4 selects a predetermined pixel drive line 10 and supplies the selected pixel drive line 10 with a pulse for driving the pixels 2, thereby driving the pixels 2 on a row-by-row basis. That is, the vertical drive circuit 4 sequentially selects and scans the respective pixels 2 of the pixel array section 3 on a row-by-row basis in the vertical direction and supplies pixel signals based on signal charges generated according to the amounts of light received in the photoelectric conversion sections of the respective pixels 2 to the column signal processing circuits 5 through vertical signal lines 9.

The column signal processing circuits 5 are arranged for the respective columns of the pixels 2. The column signal processing circuit 5 performs signal processing such as denoising on signals output from the pixels 2 in a single line, for each pixel column. For example, the column signal processing circuit 5 performs signal processing such as CDS (Correlated Double Sampling) or DDS (double data sampling) for removing pixel-specific fixed pattern noise, and AD conversion.

The horizontal drive circuit 6 includes a shift register, for example. The horizontal drive circuit 6 sequentially selects the respective column signal processing circuits 5 by sequentially outputting horizontal scan pulses and causes the respective column signal processing circuits 5 to output pixel signals to a horizontal signal line 11.

The output circuit 7 performs signal processing on signals sequentially supplied from the respective column signal processing circuits 5 through the horizontal signal line 11 and outputs the resultant. The output circuit 7 may perform only buffering in some cases, or may perform black level adjustment, column variation correction, various kinds of digital signal processing, and the like in other cases, for example. An input/output terminal 13 exchanges signals with the outside.

The imaging device 1 configured as described above is a what is generally called column AD-type CMOS image sensor in which the column signal processing circuits 5 configured to perform CDS processing or DDS processing and AD conversion processing are arranged for the respective pixel columns.

Example of Circuit Configuration of Pixel

Figure 2:
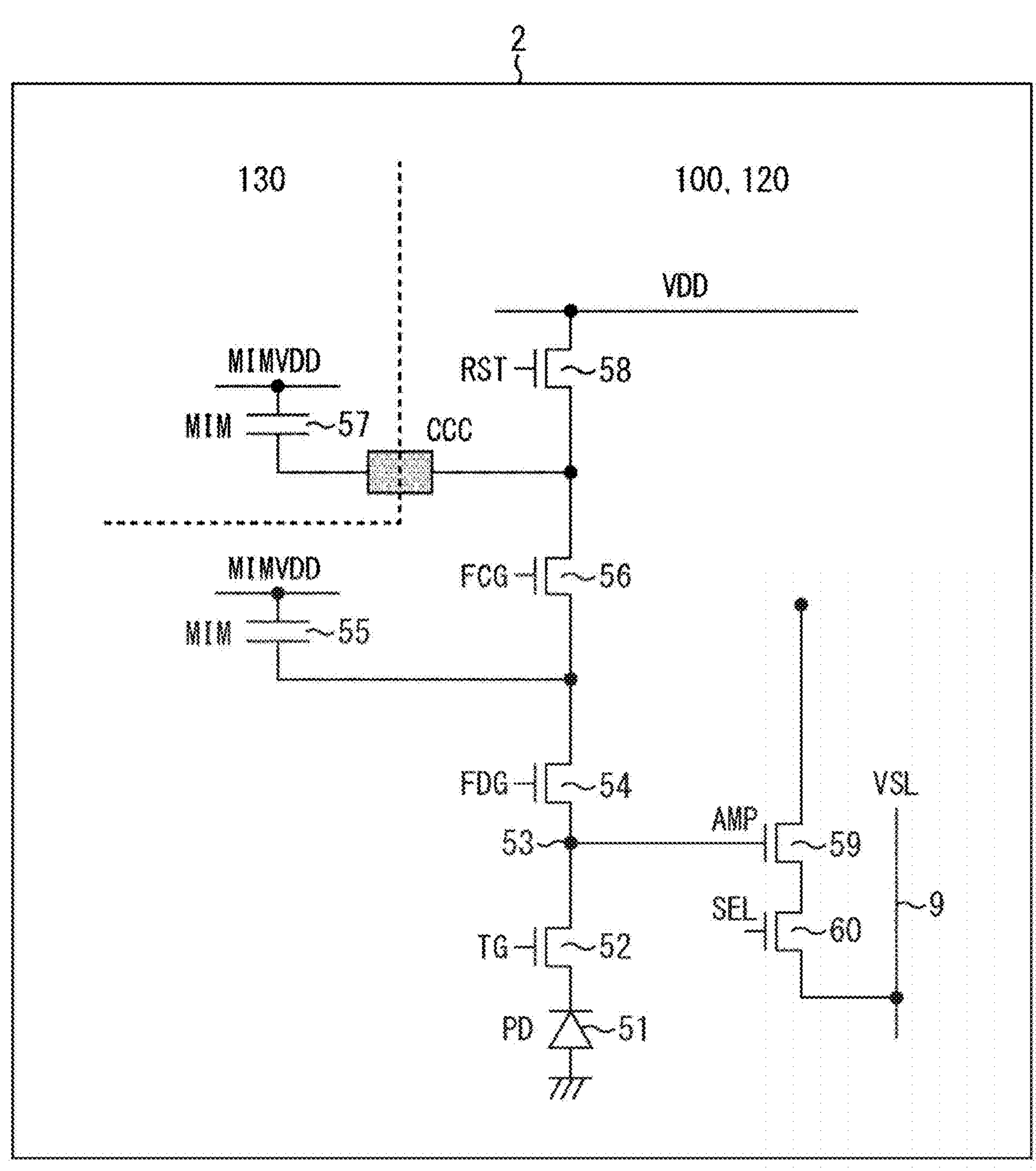
FIG. 2 is a diagram depicting an example of a circuit configuration of a pixel.

The configuration of a unit pixel provided in the pixel array section 3 is described. The unit pixel provided in the pixel array section 3 is configured as depicted in FIG. 2, for example. Note that, in the descriptions of FIG. 2 and the subsequent figures, parts corresponding to those in the case of FIG. 1 are denoted by the same reference symbols, and the descriptions thereof are appropriately omitted. FIG. 2 is a diagram depicting an example of a circuit configuration of the pixel 2.

Referring to FIG. 2, the pixel 2 which is a unit pixel includes a photoelectric conversion section 51, a transfer transistor 52, an FD (Floating Diffusion) section 53, a first conversion efficiency switching transistor 54, an MIM (Metal-Insulator-Metal) capacitive element 55, a second conversion efficiency switching transistor 56, an MIM capacitive element 57, a reset transistor 58, an amplification transistor 59, and a selection transistor 60.

For the pixels 2, a plurality of drive lines are wired for the respective pixel rows as the pixel drive lines 10, for example. Then, from the vertical drive circuit 4, a drive signal TG, a drive signal FDG, a drive signal FCG, a drive signal RST, and a drive signal SEL are supplied to the transfer transistor 52, the first conversion efficiency switching transistor 54, the second conversion efficiency switching transistor 56, the reset transistor 58, and the selection transistor 60, respectively, through the plurality of drive lines.

These drive signals are pulse signals that enter the active state when entering a high level (for example, power supply voltage VDD) state and enter the non-active state when entering a low level (for example, negative potential) state. That is, when each of the drive signals from the drive signal TG to the drive signal SEL is at a high level, the transistor supplied with the corresponding signal enters the conductive state, that is, the on state, and when each drive signal is at a low level, the transistor supplied with the corresponding signal enters the non-conductive state, that is, the off state.

The photoelectric conversion section 51 includes a PN junction photodiode, for example. The photoelectric conversion section 51 receives incident light, performs a photoelectric conversion, and accumulates the thus obtained charges.

The transfer transistor 52 is provided between the photoelectric conversion section 51 and the FD section 53, and a gate electrode of the transfer transistor 52 is supplied with the drive signal TG. When this drive signal TG is at a high level, the transfer transistor 52 is turned on, and charges accumulated in the photoelectric conversion section 51 are transferred to the FD section 53 through the transfer transistor 52.

The FD section 53 is a floating diffusion region, which is called "floating diffusion," and functions as an accumulation section configured to temporarily accumulate transferred charges and overflow charges from the photoelectric conversion section 51.

The first conversion efficiency switching transistor 54 is provided between the FD section 53 and the MIM capacitive element 55, and the gate electrode of the first conversion efficiency switching transistor 54 is supplied with the drive signal FDG. When this drive signal FDG is at a high level, the first conversion efficiency switching transistor 54 is turned on, and charges from the FD section 53 are transferred to the MIM capacitive element 55 through the first conversion efficiency switching transistor 54. The MIM capacitive element 55 also functions as an accumulation section configured to temporarily accumulate overflow charges from the photoelectric conversion section 51.

When the first conversion efficiency switching transistor 54 is turned on, a combined region of the FD section 53 and the MIM capacitive element 55 serves as a region in which charges are accumulated, thereby enabling the switching of the conversion efficiency in converting charges generated in the photoelectric conversion section 51 into voltage. The first conversion efficiency switching transistor 54 functions as a conversion efficiency switching transistor for conversion efficiency switching.

The second conversion efficiency switching transistor 56 is provided between the MIM capacitive element 55 and the MIM capacitive element 57, and the gate electrode of the second conversion efficiency switching transistor 56 is supplied with the drive signal FCG. When this drive signal FCG is at a high level, the second conversion efficiency switching transistor 56 is turned on, and charges from the MIM capacitive element 55 are transferred to the MIM capacitive element 57 through the second conversion efficiency switching transistor 56.

When the second conversion efficiency switching transistor 56 is turned on, a combined region of the FD section 53, the MIM capacitive element 55, and the MIM capacitive element 57 serves as a region in which charges are accumulated, thereby enabling the switching of the conversion efficiency in converting charges generated in the photoelectric conversion section 51 into voltage. The second conversion efficiency switching transistor 56 functions as a conversion efficiency switching transistor for conversion efficiency switching.

The MIM capacitive element 55 and the MIM capacitive element 57 each achieve high capacitance without sacrificing the area of the surface of a Si (silicon) substrate, on which the pixel transistors are arranged, and are larger in capacitance than the FD section 53.

The reset transistor 58 is connected between the power supply VDD and the MIM capacitive element 57, and the gate electrode of the reset transistor 58 is supplied with the drive signal RST. When the drive signal RST is at a high level, the reset transistor 58 is turned on, and the potential of the MIM capacitive element 57 is reset to the level of the power supply voltage VDD.

The amplification transistor 59 has a gate electrode connected to the FD section 53 and a drain connected to the power supply VDD and serves as an input section of a readout circuit configured to read out signals corresponding to charges held in the FD section 53, that is, as an input section of what is generally called a source follower circuit. That is, by connecting the source of the amplification transistor 59 to the vertical signal line 9 through the selection transistor 60, the amplification transistor 59 forms a constant current source (not depicted) and a source follower circuit that are connected to one end of the vertical signal line 9.

The selection transistor 60 is connected between the source of the amplification transistor 59 and the vertical signal line 9, and the gate electrode of the selection transistor 60 is supplied with the drive signal SEL. When the drive signal SEL is at a high level, the selection transistor 60 is turned on, and the pixel 2 enters the selected state. Owing to this, pixel signals output from the amplification transistor 59 are output to the vertical signal line 9 through a selection transistor 31.

Note that, hereinafter, the state where each drive signal enters the active state, that is, becomes a high level, is also referred to as the state where each drive signal is turned on, and the state where each drive signal enters the non-active state, that is, becomes a low level, is also referred to as the state where each drive signal is turned off.

The pixel 2 depicted in FIG. 2 includes the FD section 53, the MIM capacitive element 55, and the MIM capacitive element 57 and achieves, with these capacitors connected in series, a three-stage switching of the conversion efficiency in converting charges generated in the photoelectric conversion section into voltage.

High conversion efficiency (HCG) is achieved with the FD section 53. Medium conversion efficiency (MCG) is achieved with (the FD section 53 and the MIM capacitive element 55). Low conversion efficiency (LCG) is achieved with (the FD section 53, the MIM capacitive element 55, and the MIM capacitive element 57).

When the transfer transistor 52 is turned on, charges accumulated in the photoelectric conversion section 51 are received by the FD section 53 (high conversion efficiency), (the FD section 53 and the MIM capacitive element 55) (medium conversion efficiency), or (the FD section 53, the MIM capacitive element 55, and the MIM capacitive element 57) (low conversion efficiency) to be output.

The pixel 2 is configured such that, during high illumination, charges accumulated in the photoelectric conversion section 51 overflow to the FD section 53 side over the transfer transistor 52, thereby being accumulated in the FD section 53, the MIM capacitive element 55, and the MIM capacitive element 57.

With small signals, which means that the amount of received light is small, the high conversion efficiency with which charges are accumulated in the FD section 53 is set. With large signals, which means that the amount of received light is large, the low conversion efficiency with which charges are accumulated in (the FD section 53, the MIM capacitive element 55, and the MIM capacitive element 57) is set. Here, the medium conversion efficiency is further provided between the high conversion efficiency and the low conversion efficiency as conversion efficiency with which charges are accumulated in (the FD section 53 and the MIM capacitive element 55).

Charges that have overflowed from the photoelectric conversion section 51 to be accumulated in the FD section 53, the MIM capacitive element 55, and the MIM capacitive element 57 are received by (the FD section 53, the MIM capacitive element 55, and the MIM capacitive element 57) to be output, together with charges accumulated in the photoelectric conversion section 51.

A signal read out with the high conversion efficiency, a signal read out with the medium conversion efficiency, and a signal read out with the low conversion efficiency are separately subjected to AD conversion. Which readout signal is to be used is determined on the basis of the amount of each readout signal. At a junction between a signal with the high conversion efficiency and a signal with the medium conversion efficiency or at a junction between a signal with the medium conversion efficiency and a signal with the low conversion efficiency, the two kinds of readout signals may be blended to be used. By use of the blended signal, a degradation in image quality at the junction is prevented.

Example of Cross-Sectional Configuration of Pixel

Figure 3:
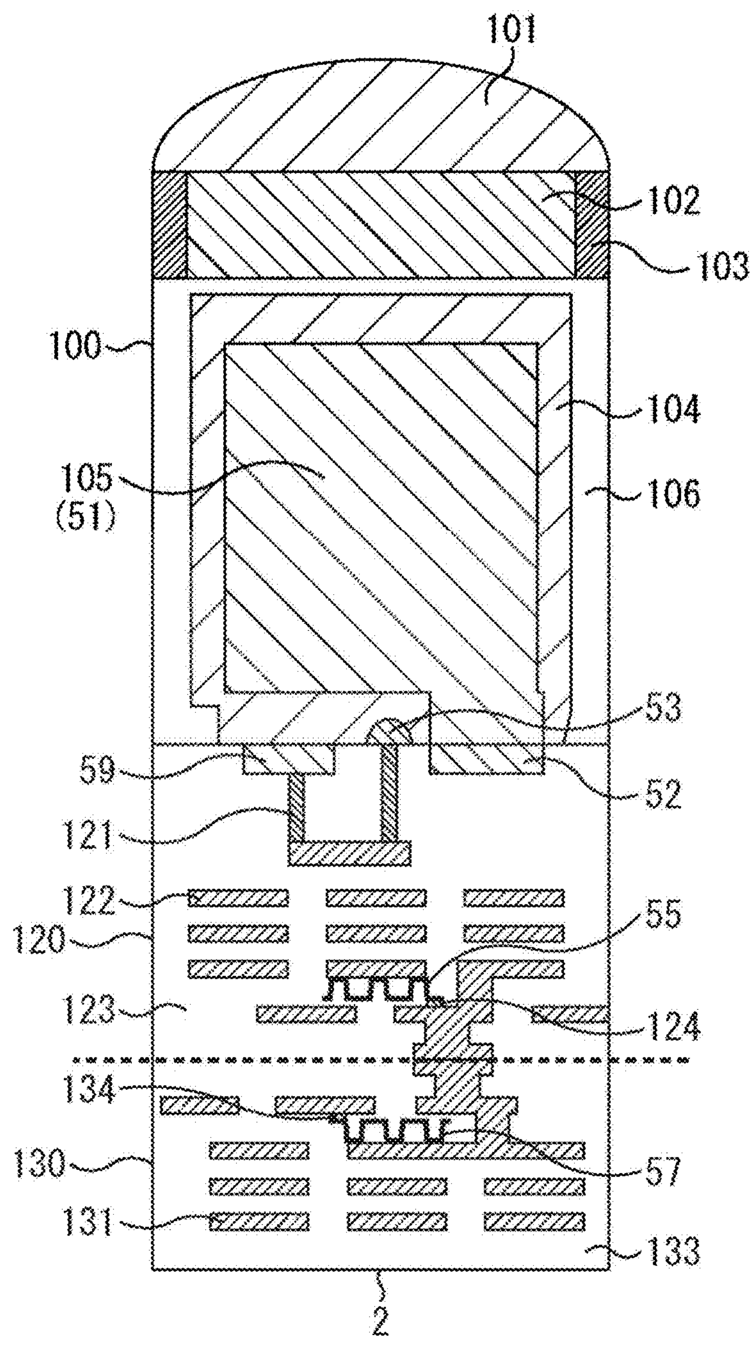
FIG. 3 is a diagram depicting an example of a cross-sectional configuration of the pixel.

FIG. 3 is a diagram depicting an example of a cross-sectional configuration of the pixel 2.

An N-type semiconductor region 105 forming the photoelectric conversion section 51 of the pixel 2 receives incident light that enters from a back surface (upper surface in FIG. 3) side of a semiconductor substrate 100. The N-type semiconductor region 105 is structured to be embedded inside the semiconductor substrate 100, and the N-type semiconductor region 105 is structured to be hardly present on a surface portion of the substrate.

Above the N-type semiconductor region 105 (photoelectric conversion section 51), a CF (color filter) 102 and an on-chip lens 101 are provided. In the photoelectric conversion section 51, incident light that has entered by sequentially passing through the respective components is received on the light-receiving surface and subjected to photoelectric conversion.

For example, the photoelectric conversion section 51 is formed with the N-type semiconductor region 105 serving as a charge accumulation region for accumulating charges (electrons). In the photoelectric conversion section 51, the N-type semiconductor region 105 is provided inside a P-type semiconductor region 104 of the semiconductor substrate 100.

Inside the semiconductor substrate 100, a pixel separation section 106 for electrically separating the plurality of pixels 2 from each other is provided. The photoelectric conversion section 51 is provided in a region defined by this pixel separation section 106. When the pixels 2 are viewed, the pixel separation section 106 is formed in a lattice pattern so as to be located between the plurality of pixels 2, for example, and the photoelectric conversion section 51 is formed in the region defined by this pixel separation section 106.

Figure 7:
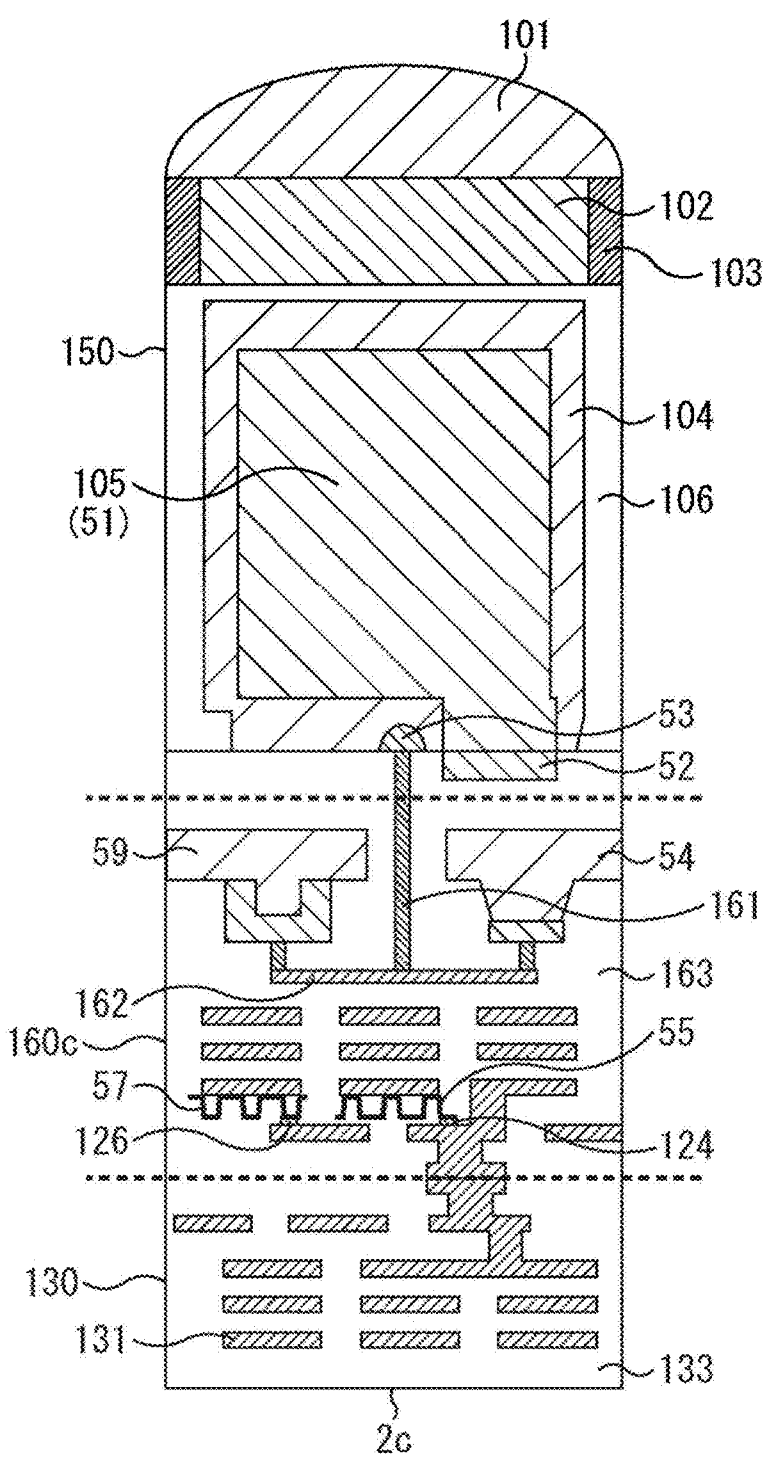
FIG. 7 is a diagram depicting an example of a cross-sectional configuration of the pixel in the third embodiment.

The pixel separation section 106 can be an FFTI (Front Full Trench Isolation) portion. When the pixel separation section 106 is formed as an FFTI portion, the FFTI portion is formed as a trench penetrating the semiconductor substrate 100 (FIG. 7). With the FFTI portion, the pixels 2 are separated from each other by an insulator, thereby achieving a configuration in which the respective pixels 2 are electrically separated. An STI (Shallow Trench Isolation) portion is provided between the respective transistors. The STI portion is structured by forming a shallow trench in the element separation region and embedding an insulating film in the shallow trench.

A wiring layer 120 is provided on a front surface (lower surface) opposite to the back surface (upper surface), on which components such as a light-shielding film 103, the CF 102, and the on-chip lens 101 are formed, of the semiconductor substrate 100.

The wiring layer 120 includes wiring lines 122 and an insulating layer 123, and in the insulating layer 123, the wiring lines 122 are formed to be electrically connected to the respective elements. The wiring layer 120 is what is generally called a multi-layer wiring layer and formed by stacking a plurality of alternating layers of interlayer insulating films forming the insulating layer 123 and the wiring lines 122. Here, as the wiring lines 122, wiring lines for the transistors for reading out charges from the photoelectric conversion section 51, such as the transfer transistor 52, and each wiring line such as the VSL 9 are stacked through the insulating layer 123.

A configuration in which a support substrate (not depicted) is provided on a surface opposite to the side on which the photoelectric conversion section 51 is provided of the wiring layer 120 can also be employed. For example, a substrate made of a silicon semiconductor with a thickness of several hundred micrometers is provided as a support substrate.

In the example represented by the configuration depicted in FIG. 3, a logic circuit substrate 130 having a logic circuit formed thereon is stacked on the wiring layer 120. The logic circuit substrate 130 includes wiring lines 131 and an insulating layer 133, and in the insulating layer 133, the wiring lines 131 are formed to be electrically connected to the respective elements. The logic circuit substrate 130 is also what is generally called a multi-layer wiring layer and formed by stacking a plurality of alternating layers of interlayer insulating films forming the insulating layer 133 and the wiring lines 131.

The light-shielding film 103 is provided on the back surface (upper surface in FIG. 3) side of the semiconductor substrate 100 and provided in the CF 102. The light-shielding film 103 is configured to block some of incident light traveling from above the semiconductor substrate 100 to below the semiconductor substrate 100. The light-shielding film 103 is formed using light-shielding materials for blocking light. For example, the light-shielding film 103 is formed by sequentially stacking a titanium (Ti) film and a tungsten (W) film. Besides this, the light-shielding film 103 can be formed by sequentially stacking a titanium nitride (TiN) film and a tungsten (W) film, for example. Further, the light-shielding film 103 may be coated with nitride (N) or the like.

On a side surface of the pixel separation section 106 (FFTI), an SCF (fixed charge film) or a P-type semiconductor region (solid-phase diffusion layer) may be formed. The fixed charge film is formed using a high dielectric material with negative fixed charges to form a positive charge (hole) accumulation region at an interface with the semiconductor substrate 100, thereby preventing generation of dark current. Since the fixed charge film is formed so as to have negative fixed charges, owing to the negative fixed charges thereof, an electric field is applied to the interface with the semiconductor substrate 100, and a positive charge (hole) accumulation region is formed.

The fixed charge film can be formed using a hafnium oxide film ($HfO_2$ film), for example. Further, besides, the fixed charge film can be formed to contain at least one of hafnium, zirconium, aluminum, tantalum, titanium, magnesium, yttrium, and lanthanide element oxides, for example.

A configuration in which, as a solid-phase diffusion layer with solid-phase diffused P-type impurities, a layer having a P-type semiconductor region conformally formed therein is formed on a side wall of the FFTI portion can also be employed.

Note that, here, a case where a PN junction is formed by the N-type semiconductor region 105 contained inside the semiconductor substrate 100 and the P-type semiconductor region 104 formed around the N-type semiconductor region 105, thereby forming a photodiode is described as an example. However, the N-type and the P-type may be reversed. In a case where the N-type and the P-type are reversed, in the above and following description, the pixel 2 can be configured by reading the N-type as the P-type and the P-type as the N-type.

A structure in which $SiO_2$ or the like is embedded inside the pixel separation section 106 may be employed. By embedding $SiO_2$ or the like inside the pixel separation section 106 (the trench formed as the FFTI portion), it is possible to achieve a configuration in which the adjacent pixels 2 are more positively separated.

By providing such a pixel separation section 106, the pixels 2 are electrically separated from each other, thereby making it possible to prevent leakage charges from the photoelectric conversion section 51 (PD: Photo Diode) from leaking into the adjacent pixels 2. Thus, the overflow barrier on the transfer transistor 52 side can be increased to increase the Qs (saturation charge amount) of the photoelectric conversion section 51.

The example of the cross-sectional configuration of the pixel 2 depicted in FIG. 3 represents the configuration in which the transfer transistor 52 is formed on the right side in FIG. 3, and the N-type semiconductor region 105 formed as an extended part of the N-type semiconductor region 105 formed in the semiconductor substrate 100 is connected to the transfer transistor 52. In a central portion in the semiconductor substrate 100, the FD section 53 formed with an N+ region is formed. The FD section 53 is connected to the amplification transistor 59 depicted on the left side in FIG. 3 through a local wiring line 121.

The local wiring line 121 is formed using polysilicon or an advanced contact (MIS contact). An advanced contact is a contact that uses a high dielectric constant insulating film. In a case where the local wiring line 121 is an advanced contact including a high dielectric constant insulating film, in the example depicted in FIG. 7, the local wiring line 121 is a metal insulating film inserted between the FD section 53 and the gate electrode of the amplification transistor 59. For example, the high dielectric constant insulating film is formed as a thin film with a thickness of approximately 2.0 nm to 3.0 nm, using a metal oxide with a high dielectric constant, such as titanium dioxide ($TiO_2$).

In a case where the local wiring line 121 is formed using an advanced contact, the N-type concentration of the FD section 53 can be set to low, thereby enabling reduction of the contact resistance. By setting the N-type concentration of the FD section 53 to low, the electric field strength at the PN junction with the semiconductor substrate 100 (P-type semiconductor region 104) is weakened, so that generation of dark current can be prevented. Accordingly, the pixel 2 can avoid the mixing of dark current into charge signals and prevent the occurrence of FPN (Fixed Pattern Noise) due to variations in FD dark current leakage to enhance the S/N at the junctions of the plurality of conversion efficiencies due to FPN, thereby enabling image quality enhancement.

Note that, here, although the example in which the FD section 53 is connected to the amplification transistor 59 through the local wiring line 121 is described, a configuration in which the local wiring line 121 (advanced contact) is used for contacts other than that with the FD section 53 may be employed.

In the wiring layer 120 of the pixel 2 depicted in FIG. 3, the wiring lines 122 are formed in six layers. In a case where the six layers are regarded as the first layer, the second layer, the third layer, the fourth layer, the fifth layer, and the sixth layer in order from the upper side (semiconductor substrate 100 side) in FIG. 3, between the wiring line 122 in the fourth layer and the wiring line 122 in the fifth layer, the MIM capacitive element 55 is three-dimensionally formed. The MIM capacitive element 55 is a three-dimensionally formed capacitor having a trench with a capacitive film formed on the side wall thereof.

One electrode of the MIM capacitive element 55 is connected to the wiring line 122 in the fourth layer, and the other electrode is connected to the wiring line 122 in the fifth layer through a via 124. The wiring line 122 in the sixth layer is used as a terminal to be connected to the logic circuit substrate 130.

The wiring line 122 in the bottom layer of the wiring layer 120 is connected to the wiring line 131 in the top layer of the logic circuit substrate 130 by metallic bonding. Here, copper (Cu) can be used as the metal for metallic bonding, which is sometimes referred to as "Cu—Cu bonding," for example. In the figures, surfaces to be Cu—Cu bonded are denoted by the symbol "CCC" for description.

The logic circuit substrate 130 is also configured by stacking the plurality of wiring lines 131. In the case depicted in FIG. 3, the logic circuit substrate 130 has five layers. In a case where the five layers are regarded as the first layer, the second layer, the third layer, the fourth layer, and the fifth layer in order from the upper side (wiring layer 120 side) in FIG. 3, the wiring line 131 in the first layer is connected to the wiring line 122 in the bottom layer of the wiring layer 120 as described above. The wiring line 131 in the first layer is connected to the wiring line 131 in the second layer through a via.

Between the wiring line 131 in the second layer and the wiring line 131 in the third layer, the MIM capacitive element 57 is three-dimensionally formed. This MIM capacitive element 57 is also a three-dimensionally formed capacitor having a trench with a capacitive film formed on the side wall thereof, like the MIM capacitive element 55.

In this way, the pixel 2 includes the capacitors, namely, the FD section 53, the MIM capacitive element 55, and the MIM capacitive element 57. The MIM capacitive element 55 is formed in the wiring layer 120 of the semiconductor substrate 100, while the MIM capacitive element 57 is formed in the logic circuit substrate 130.

As depicted in FIG. 3, the pixel 2 is configured by stacking the semiconductor substrate 100 including the wiring layer 120 on the logic circuit substrate 130. Referring again to FIG. 2, the semiconductor substrate 100 includes the photoelectric conversion section 51, the transfer transistor 52, the FD section 53, the first conversion efficiency switching transistor 54, the MIM capacitive element 55, the second conversion efficiency switching transistor 56, the reset transistor 58, the amplification transistor 59, and the selection transistor 60. The logic circuit substrate 130 includes the MIM capacitive element 57.

In the pixel 2, the three capacitors, namely, the FD section 53, the MIM capacitive element 55, and the MIM capacitive element 57, are included, and those capacitors are used to achieve the three conversion efficiencies and implement the three-time readout configuration, thereby making it possible to prevent the degradation of the S/N level differences at the junctions.

Configuration of Pixel in Second Embodiment

Figure 4:
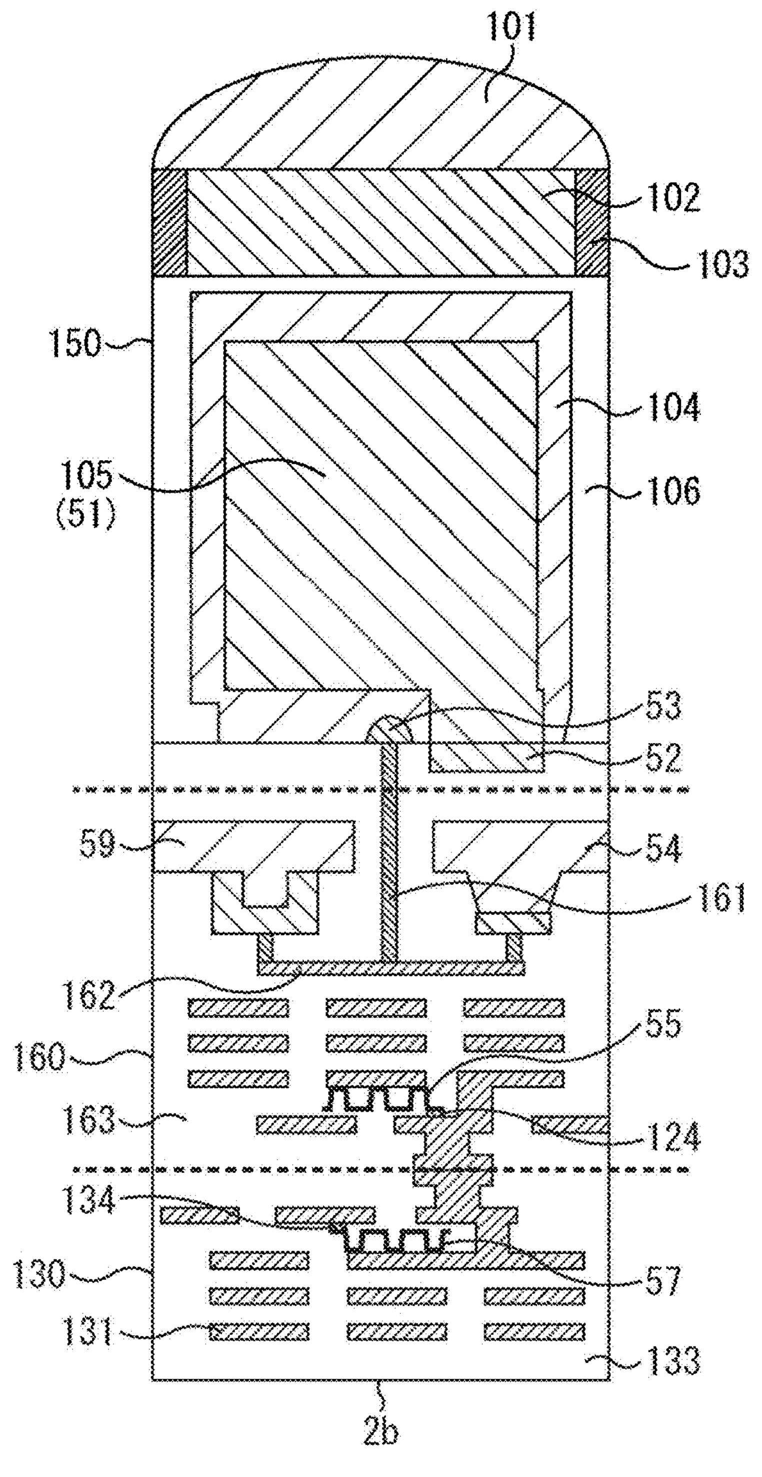
FIG. 4 is a diagram depicting an example of a cross-sectional configuration of a pixel in a second embodiment.
Figure 5:
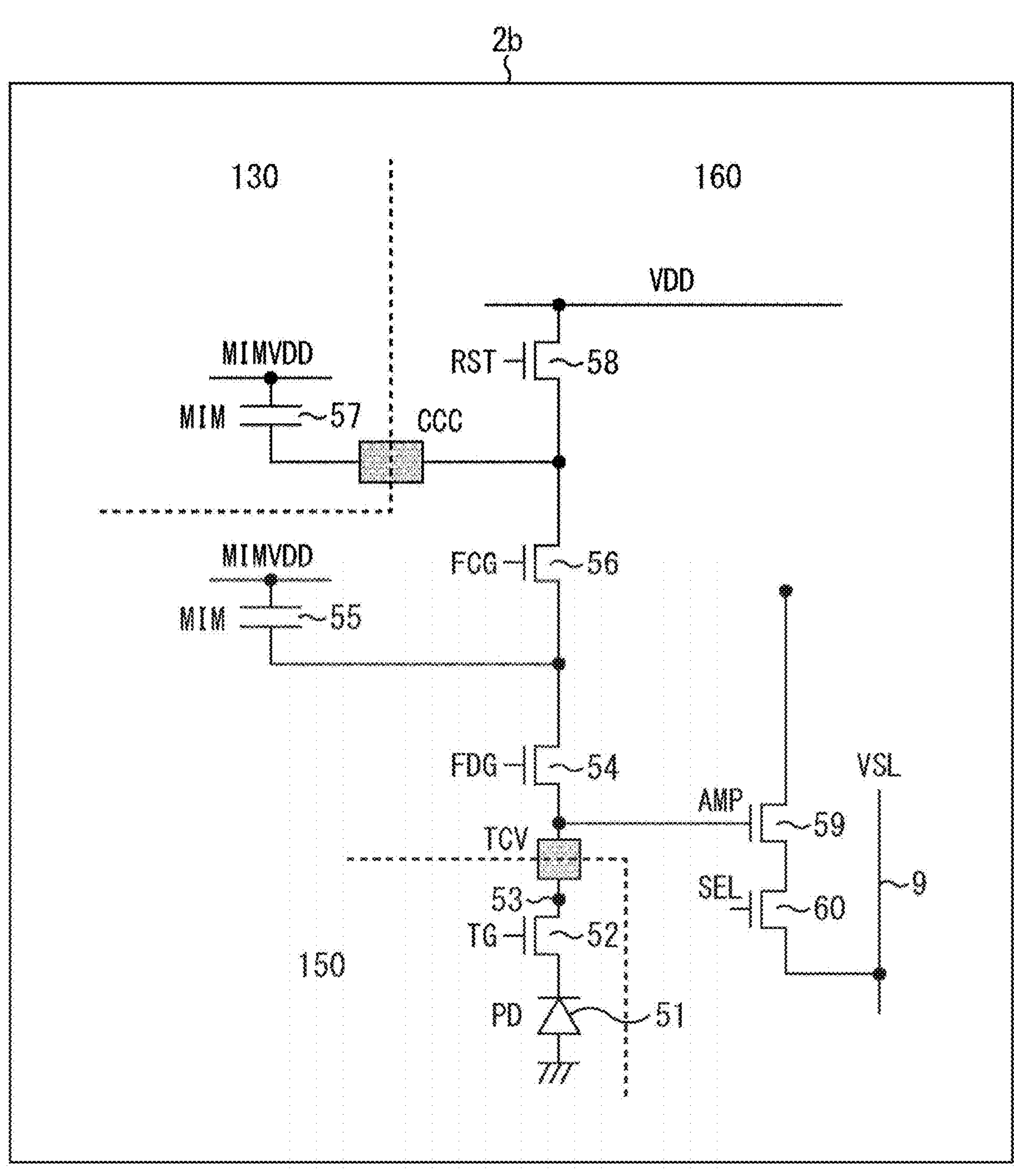
FIG. 5 is a diagram depicting an example of a circuit configuration of the pixel in the second embodiment.

FIG. 4 is a diagram depicting an example of a cross-sectional configuration of a pixel 2*b* in a second embodiment. FIG. 5 is a diagram depicting an example of a circuit configuration of the pixel 2*b*. In the following description, the pixel 2 described with reference to FIG. 2 and FIG. 3 is referred to as "pixel 2*a*" as the pixel 2 in the first embodiment. In the following description, the same parts as the pixel 2*a* in the first embodiment are denoted by the same reference symbols, and the descriptions thereof are appropriately omitted.

The pixel 2*b* in the second embodiment is different from the pixel 2*a* in the first embodiment in being configured by stacking three layers of substrates and is essentially the same as the pixel 2*a* in terms of the remaining points.

Referring to FIG. 4, the pixel 2*b* is configured by stacking a first semiconductor substrate 150, a second semiconductor substrate 160, and the logic circuit substrate 130. The pixel 2 is manufactured by separately manufacturing the first semiconductor substrate 150, the second semiconductor substrate 160, and the logic circuit substrate 130 in different processes, stacking the substrates in a wafer state, and singulating the stacked substrates. Alternatively, the pixel 2 is manufactured by singulating each of the first semiconductor substrate 150, the second semiconductor substrate 160, and the logic circuit substrate 130 and then stacking these substrates.

The first semiconductor substrate 150 and the second semiconductor substrate 160 correspond to the semiconductor substrate 100 including the wiring layer 120 in the pixel 2*a* depicted in FIG. 3 and have an equivalent configuration to the semiconductor substrate 100 including the wiring layer 120. The first semiconductor substrate 150 includes the photoelectric conversion section 51.

The second semiconductor substrate 160 includes wiring lines 162 which correspond to the wiring lines 122 formed in the wiring layer 120 (FIG. 3), and the wiring lines 162 are formed in an insulating layer 163. Transistors are also formed in the second semiconductor substrate 160. In the example depicted in FIG. 4, the first conversion efficiency switching transistor 54 and the amplification transistor 59 are formed and connected to the FD section 53 formed in the first semiconductor substrate 150 through a TCV (Through-CIS-Via) 161.

The wiring lines 162 of the second semiconductor substrate 160 of the pixel 2*b* depicted in FIG. 4 are formed in six layers. In a case where the six layers are regarded as the first layer, the second layer, the third layer, the fourth layer, the fifth layer, and the sixth layer in order from the upper side (first semiconductor substrate 150 side) in FIG. 4, the wiring line in the first layer is connected to the TCV 161 to be connected to a contact connected to the first conversion efficiency switching transistor 54 and a contact connected to the amplification transistor 59.

Between the wiring line 162 in the fourth layer and the wiring line 162 in the fifth layer, the MIM capacitive element 55 is three-dimensionally formed. One electrode of the MIM capacitive element 55 is connected to the wiring line 162 in the fourth layer, and the other electrode is connected to the wiring line 162 in the fifth layer through the via 124. The wiring line 162 in the fifth layer is connected to the wiring line 162 in the sixth layer by a vertically formed wiring line, and the wiring line 162 in the sixth layer is used as a connection terminal to be Cu—Cu bonded to the logic circuit substrate 130.

The logic circuit substrate 130 has a similar configuration to the logic circuit substrate 130 depicted in FIG. 3 and includes the MIM capacitive element 57 three-dimensionally formed between the wiring line 131 in the second layer and the wiring line 131 in the third layer.

Referring to the example of the circuit configuration of the pixel 2*b* depicted in FIG. 5, the circuit configuration is similar to that of the pixel 2*a* depicted in FIG. 2. The first semiconductor substrate 150 includes the photoelectric conversion section 51, the transfer transistor 52, and the FD section 53.

The second semiconductor substrate 160 includes the first conversion efficiency switching transistor 54, the MIM capacitive element 55, the second conversion efficiency switching transistor 56, the reset transistor 58, the amplification transistor 59, and the selection transistor 60. The transfer transistor 52 included in the first semiconductor substrate 150 is connected to the first conversion efficiency switching transistor 54 and the amplification transistor 59 included in the second semiconductor substrate 160, through the TCV.

The logic circuit substrate 130 includes the MIM capacitive element 57. The logic circuit substrate 130 is connected to the second semiconductor substrate 160 by Cu—Cu bonding.

In the pixel 2, the three capacitors, namely, the FD section 53, the MIM capacitive element 55, and the MIM capacitive element 57, are included, and those capacitors are used to achieve the three conversion efficiencies and implement the three-time readout configuration, thereby making it possible to prevent the degradation of the S/N level differences at the junctions.

Configuration of Pixel in Third Embodiment

Figure 6:
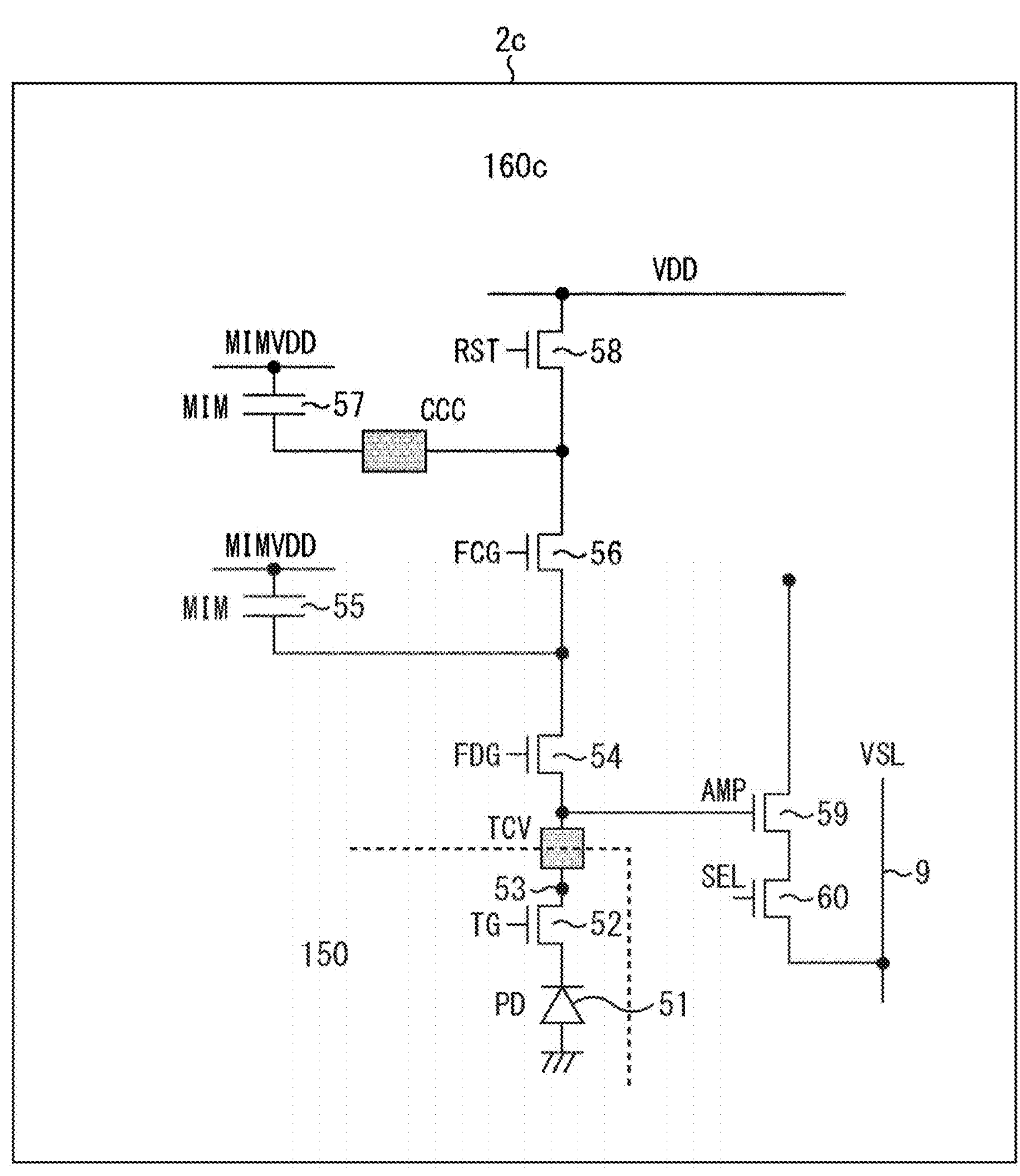
FIG. 6 is a diagram depicting an example of a circuit configuration of a pixel in a third embodiment.

FIG. 6 is a diagram depicting an example of a circuit configuration of a pixel 2*c* in a third embodiment. FIG. 7 is a diagram depicting an example of a cross-sectional configuration of the pixel 2*c*. In the following description, the same parts as the pixel 2*b* in the second embodiment are denoted by the same reference symbols, and the descriptions thereof are appropriately omitted.

The pixel 2*c* in the third embodiment is different from the pixel 2*b* in the second embodiment in that the MIM capacitive element 55 and the MIM capacitive element 57 are formed in a second semiconductor substrate 160*c* and is essentially the same as the pixel 2*b* in terms of the remaining points.

Referring to the example of the circuit configuration of the pixel 2*c* depicted in FIG. 6, the first semiconductor substrate 150 includes the photoelectric conversion section 51, the transfer transistor 52, and the FD section 53.

The second semiconductor substrate 160 includes the first conversion efficiency switching transistor 54, the MIM capacitive element 55, the second conversion efficiency switching transistor 56, the MIM capacitive element 57, the reset transistor 58, the amplification transistor 59, and the selection transistor 60. The FD section 53 included in the first semiconductor substrate 150 is connected to the first conversion efficiency switching transistor 54 and the amplification transistor 59 included in the second semiconductor substrate 160, through the TCV.

Referring to the example of the cross-sectional configuration of the pixel 2*c* depicted in FIG. 7, the MIM capacitive element 55 and the MIM capacitive element 57 are provided in the second semiconductor substrate 160*c*. The MIM capacitive element 55 and the MIM capacitive element 57 are formed between the wiring line 162 in the fourth layer and the wiring line 162 in the fifth layer of the second semiconductor substrate 160*c*.

The MIM capacitive element 55 is formed near a center of the second semiconductor substrate 160*c* in FIG. 7. One electrode of the MIM capacitive element 55 is connected to the wiring line 162 in the fourth layer, and the other electrode is connected to the wiring line 162 in the fifth layer through the via 124. Similarly, the MIM capacitive element 57 is formed on the left side of the second semiconductor substrate 160*c* in FIG. 7. One electrode of the MIM capacitive element 57 is connected to the wiring line 162 in the fourth layer, and the other electrode is connected to the wiring line 162 in the fifth layer through the via 124.

In this way, it is possible to achieve a configuration in which, in the second semiconductor substrate 160*c*, a plurality of MIM capacitive elements, such as the two MIM capacitive elements, namely, the MIM capacitive element 55 and the MIM capacitive element 57, in the example depicted in FIG. 6 and FIG. 7, are provided. In a case where the size of the pixel 2 is large, even when a plurality of MIM capacitive elements are provided in the single semiconductor substrate, the MIM capacitive elements can be formed with a size enough to ensure the capacitance of each MIM capacitive element. The configuration in which a plurality of MIM capacitive elements are provided in the second semiconductor substrate 160*c* can be applied to the pixel 2 with a relatively large size.

Although in FIG. 6 and FIG. 7, the case where the two MIM capacitive elements, namely, the MIM capacitive element 55 and the MIM capacitive element 57, are provided in the second semiconductor substrate 160 has been described as an example, a configuration in which a plurality of MIM capacitive elements are provided in the logic circuit substrate 130 can also be employed.

The third embodiment may be combined with the first embodiment to achieve a configuration in which a plurality of MIM capacitive elements are formed in the semiconductor substrate 100. The third embodiment may be combined with the second embodiment to achieve a configuration in which a plurality of MIM capacitive elements are included in the second semiconductor substrate 160, and MIM capacitive elements are also included in the logic circuit substrate 130.

In the pixel 2*c*, the three capacitors, namely, the FD section 53, the MIM capacitive element 55, and the MIM capacitive element 57, are included, and those capacitors are used to achieve the three conversion efficiencies and implement the three-time readout configuration, thereby making it possible to prevent the degradation of the S/N level differences at the junctions.

In the first to third embodiments, the capacitance of the MIM capacitive element 55 and the capacitance of the MIM capacitive element 57 may be the same or different.

Operation of Pixel 2

Figure 8:
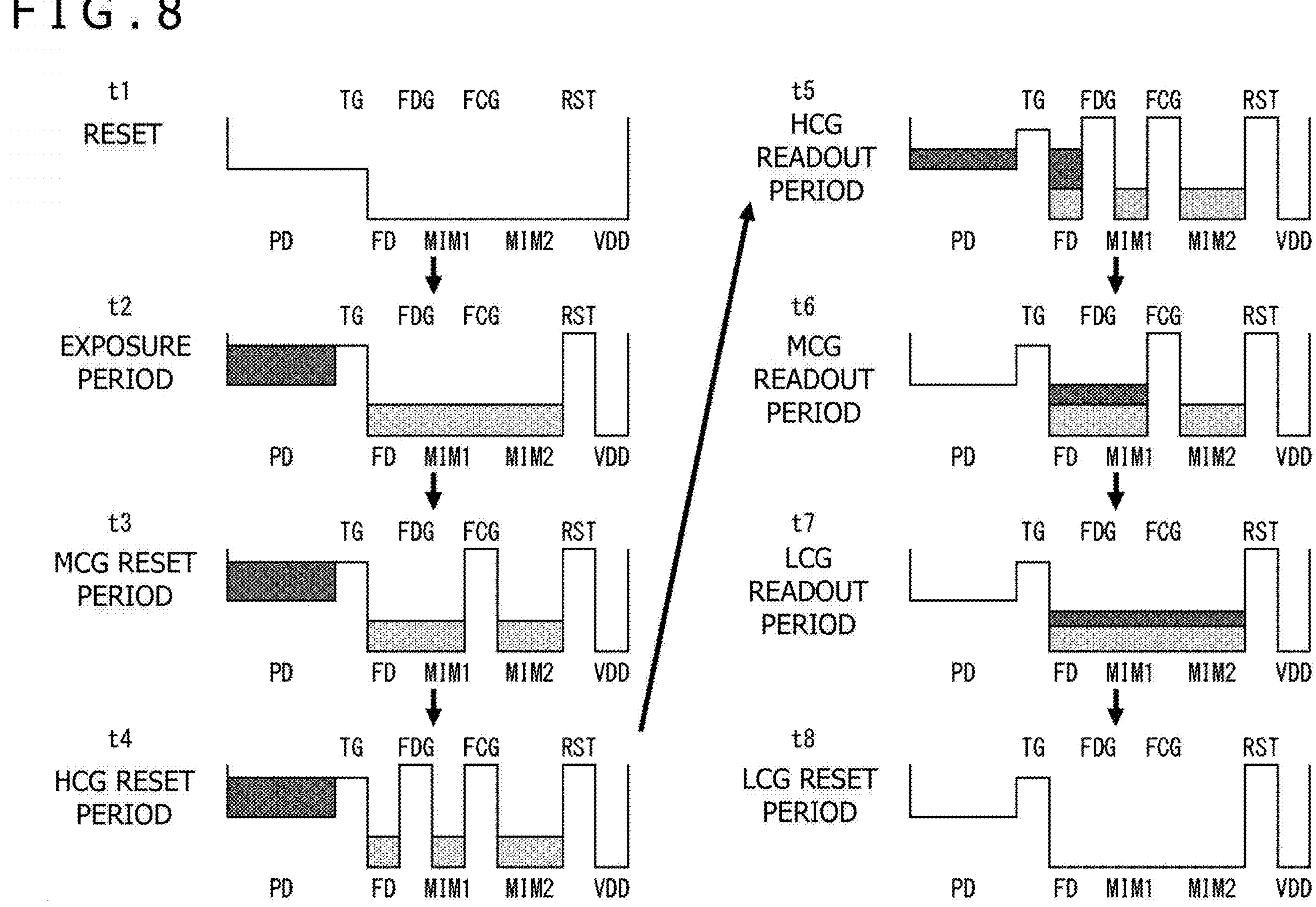
FIG. 8 is a diagram depicting an operation of the pixel.

The operation of the pixel 2 in one of the first to third embodiments is described with reference to FIG. 8. In FIG. 8, PD represents the photoelectric conversion section 51, FD represents the FD section 53, MIM1 represents the MIM capacitive element 55, and MIM2 represents the MIM capacitive element 57.

At time t1, a reset operation on the pixel 2 is performed. The reset operation is executed in a case where the shutter operates, for example, and the drive signal TG supplied to the transfer transistor 52, the drive signal FDG supplied to the first conversion efficiency switching transistor 54, the drive signal FCG supplied to the second conversion efficiency switching transistor 56, and the drive signal RST supplied to the reset transistor 58 are turned on. The respective drive signals are turned on for predetermined periods and then turned off.

In an exposure period at time t2, the drive signal TG and the drive signal RST are in the off state, while the drive signal FDG and the drive signal FCG are in the on state. During the exposure period, charges are accumulated in the photoelectric conversion section 51. During the exposure period, overflow charges from the photoelectric conversion section 51 through the transfer transistor 52 are transferred to the FD section 53, the MIM capacitive element 55, and the MIM capacitive element 57.

At time t3, an MCG (medium conversion efficiency) reset period is provided. In the MCG reset period, the drive signal FCG and the drive signal FDG are turned on for predetermined periods, and then the drive signal FDG remains on while the drive signal FCG is turned off, and the drive signal SEL is turned on to perform MCG reset. Since the MCG (medium conversion efficiency) corresponds to the case of using the FD section 53 and the MIM capacitive element 55, the FD section 53 and the MIM capacitive element 55 are reset in the MCG reset period.

At time t4, an HCG (high conversion efficiency) reset period is provided. The high conversion efficiency is achieved with the FD section 53. In the HCG reset period, the drive signal TG, the drive signal FDG, the drive signal FCG, and the drive signal RST are in the off state. By turning on the drive signal SEL, the FD section 53 is reset.

When readout from the photoelectric conversion section 51 (PD: photodiode) starts, the drive signal TG supplied to the transfer transistor 52 is turned on for a predetermined period. The readout from the photodiode is performed by CDS (correlated double sampling) drive. CDS drive is a drive in which, after the FD has been reset to a predetermined potential and the predetermined potential in question has been read out as a reset potential, signal charges accumulated in the PD are transferred to the FD, and the signal charges in the FD are read as a signal level.

As described later, after the readout from the photodiode by CDS drive has been performed, readout from the photodiode and the MIM capacitive elements by DDS (double data sampling) drive is performed. DDS drive is a drive in which signal charges held or accumulated in the FD are read out as a signal level, then the FD is reset to a predetermined potential, and the predetermined potential in question is read out as a reset level.

Since the readout from the PD is performed by CDS drive, as described above, the MCG reset period and the HCG reset period are provided, and in the respective periods, a reset signal for the medium conversion efficiency and a reset signal for the high conversion efficiency are acquired.

At time t5, an HCG readout period is provided. For a predetermined time prior to the start of the HCG readout period, the drive signal TG is turned on to turn on the transfer transistor 52, and charges are transferred from the photoelectric conversion section 51 to the FD section 53. After the drive signal TG has been turned off again, the drive signal SEL is turned on to put the selection transistor 60 into the on state. Since the high conversion efficiency is achieved with the FD section 53, in the HCG readout period, charges accumulated in the FD section 53 are read out.

At time t6, an MCG readout period is provided. When the HCG readout period ends, the drive signal SEL is turned off again, and the drive signal FDG is turned on to turn on the first conversion efficiency switching transistor 54. When the first conversion efficiency switching transistor 54 is turned on, the drive signal TG is turned on to turn on the transfer transistor 52. When the transfer transistor 52 and the first conversion efficiency switching transistor 54 are turned on, a state where charges flow to the FD section 53 and the MIM capacitive element 55 is established.

After the drive signal TR has been turned off again, the drive signal SEL is turned on to put the selection transistor 60 into the on state, and charges accumulated in the FD section 53 and the MIM capacitive element 55 are read out.

At time t7, an LCG readout period is provided. After the end of the MCG readout period, the drive signal FCG and the drive signal TG are put into the on state. Since the drive signal FDG remains on, the transfer transistor 52, the first conversion efficiency switching transistor 54, and the second conversion efficiency switching transistor 56 are in the on state, resulting in a state where charges are transferred to the FD section 53, the MIM capacitive element 55, and the MIM capacitive element 57.

Since the low conversion efficiency is achieved with (the FD section 53, the MIM capacitive element 55, and the MIM capacitive element 57), in the LCG readout period, charges accumulated in (the FD section 53, the MIM capacitive element 55, and the MIM capacitive element 57) are read out.

At time t8, an LCG reset period is provided. When the LCG readout period ends, the drive signal SEL is turned off. After the drive signal SEL has been turned off, the drive signal RST is turned on for a predetermined time to put the reset transistor 58 into the on state, and the FD section 53, the MIM capacitive element 55, and the MIM capacitive element 57 are reset.

When the LCG reset period ends, the drive signal SEL is turned off again. Such a series of operations is performed to read out a signal with the HCG (high conversion efficiency), a signal with the MCG (medium conversion efficiency), and a signal with the LCG (low conversion efficiency).

According to the configuration and operation of the pixel 2 as described above, it is possible to expand the Qs (saturation charge amount) by an overflow drive using the MIM capacitive element 57 as a capacitive element. Since the pixels are separated from each other by the through trench (pixel separation section 106) penetrating the semiconductor substrate 100, blooming to the adjacent pixels can be prevented, and hence the potential under the transfer transistor can be increased. With this, the Qs of the photodiode (photoelectric conversion section 51) is increased, so that the S/N level differences at the junctions during high illumination can be reduced.

With the three-time readout configuration using the three conversion efficiencies, it is possible to prevent the degradation of the S/N level differences at the junctions.

Configuration of Pixel in Fourth Embodiment

Figure 9:
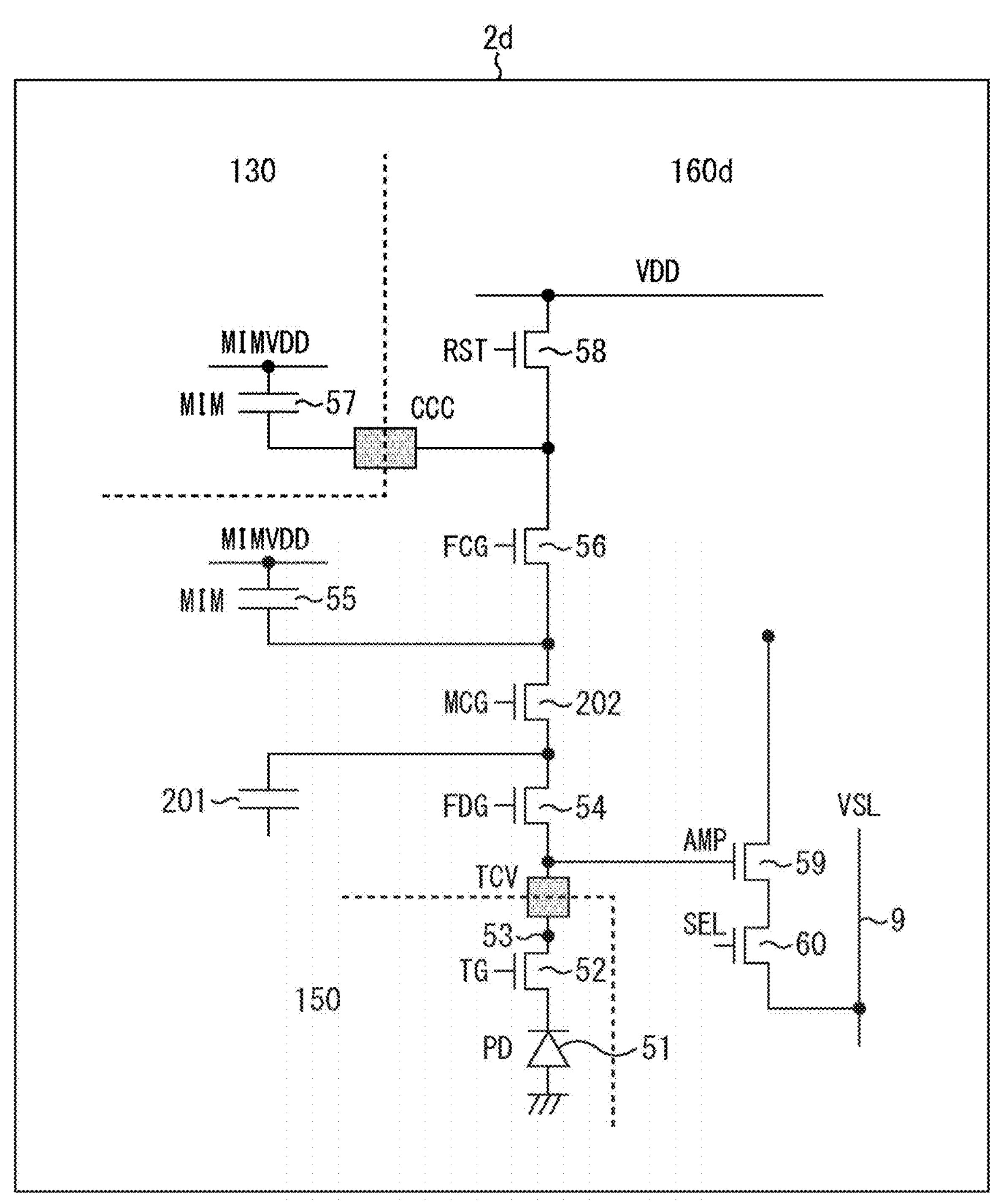
FIG. 9 is a diagram depicting an example of a circuit configuration of a pixel in a fourth embodiment.
Figure 10:
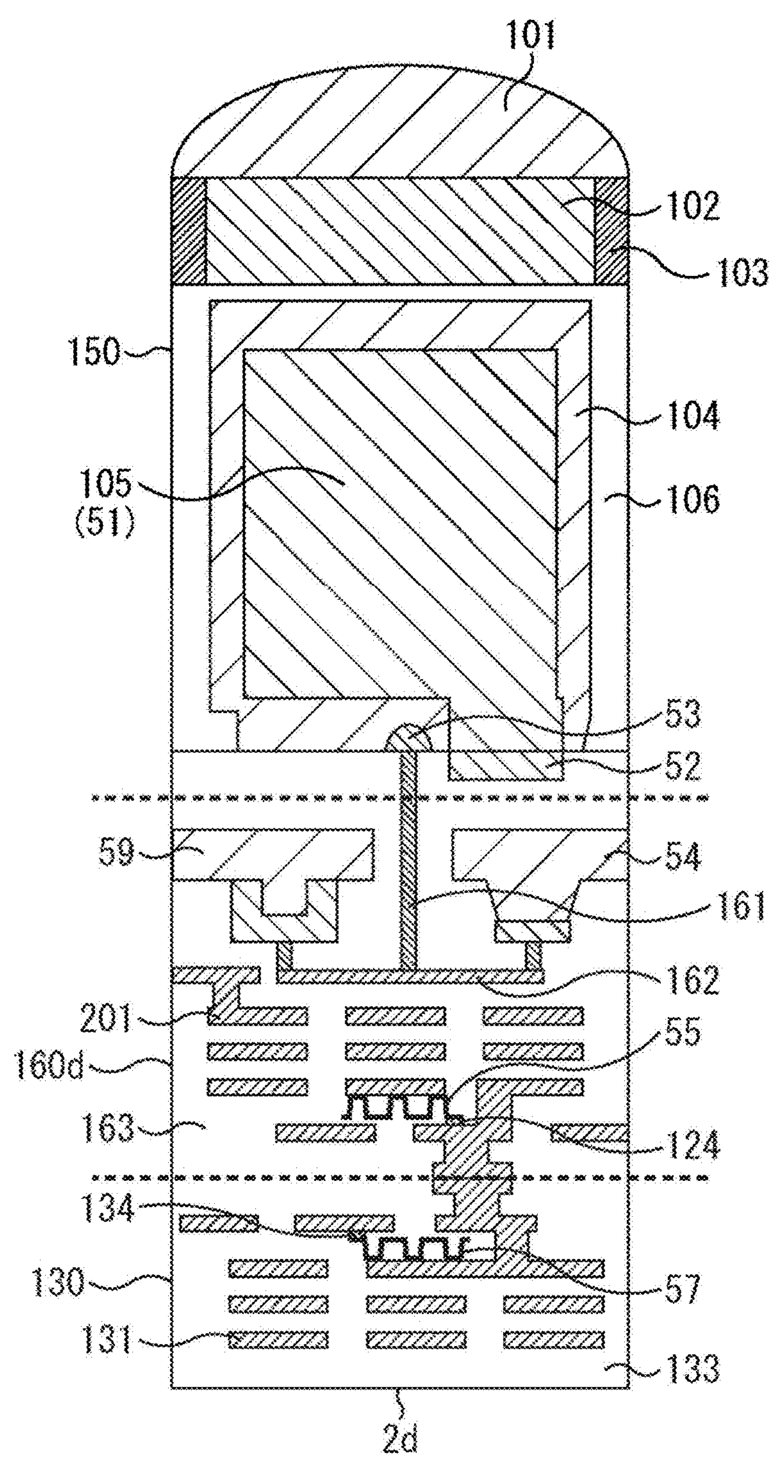
FIG. 10 is a diagram depicting an example of a cross-sectional configuration of the pixel in the fourth embodiment.

FIG. 9 is a diagram depicting an example of a circuit configuration of a pixel 2*d* in a fourth embodiment. FIG. 10 is a diagram depicting an example of a cross-sectional configuration of the pixel 2*d*. In the following description, the same parts as the pixel 2*b* in the second embodiment are denoted by the same reference symbols, and the descriptions thereof are appropriately omitted.

The pixel 2*d* in the fourth embodiment is configured by further adding a wiring capacity 201 to the pixel 2*b* in the second embodiment.

Referring to the example of the circuit configuration of the pixel 2*d* depicted in FIG. 9, the first semiconductor substrate 150 includes the photoelectric conversion section 51, the transfer transistor 52, and the FD section 53.

The second semiconductor substrate 160 includes the first conversion efficiency switching transistor 54, the MIM capacitive element 55, the second conversion efficiency switching transistor 56, the reset transistor 58, the amplification transistor 59, the selection transistor 60, the wiring capacity 201, and a third conversion efficiency switching transistor 202.

The logic circuit substrate 130 includes the MIM capacitive element 57.

The wiring capacity 201 is provided between the first conversion efficiency switching transistor 54 and the third conversion efficiency switching transistor 202. The pixel 2*d* includes, as accumulation sections configured to accumulate charges from the photoelectric conversion section 51, four components, namely, the FD section 53, the wiring capacity 201, the MIM capacitive element 55, and the MIM capacitive element 57.

Referring to the example of the cross-sectional configuration of the pixel 2*d* depicted in FIG. 10, in a second semiconductor substrate 160*d*, the MIM capacitive element 55 and the wiring capacity 201 are provided. The MIM capacitive element 55 is formed between the wiring line 162 in the fourth layer and the wiring line 162 in the fifth layer of the second semiconductor substrate 160*d*. The wiring capacity 201 is provided between the wiring line 162 in the first layer and the wiring line 162 in the second layer.

Figure 11:
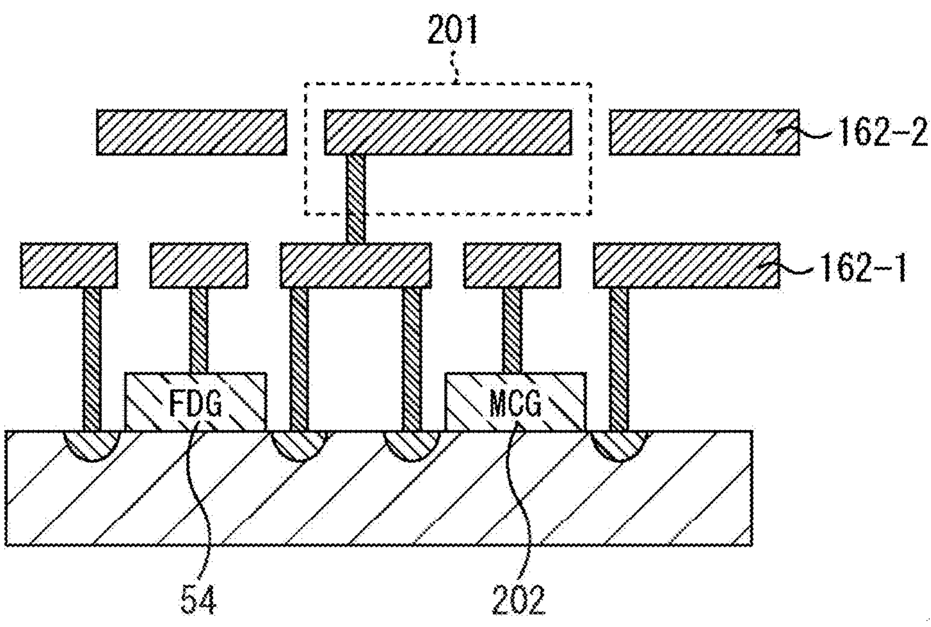
FIG. 11 is a diagram depicting a configuration of a wiring capacity.

FIG. 11 is an enlarged diagram of the portion of the wiring capacity 201. The wiring capacity 201 is allocated with a wiring line 161-2 formed in a predetermined layer of the wiring lines 161 having a multilayer structure of the second semiconductor substrate 160*d*. The wiring line 161-2 forming the wiring capacity 201 is connected to a wiring line 162-1. This wiring line 162-1 is connected to an N+ diffusion layer formed in the layer in which the first conversion efficiency switching transistor 54 and the third conversion efficiency switching transistor 202 are formed.

The wiring capacity 201 is configured using a part of the wiring lines 161 having a multilayer structure of the second semiconductor substrate 160*d*. The pixel 2*d* further includes such a wiring capacity 201 as an accumulation section.

In the pixel 2*d*, the four capacitors, namely, the FD section 53, the MIM capacitive element 55, the MIM capacitive element 57, and the wiring capacity 201 are included, and those capacitors are used to achieve the four conversion efficiencies and implement the four-time readout configuration, thereby making it possible to prevent the degradation of the S/N level differences at the junctions.

Although, in FIG. 9 and FIG. 10, the case where the wiring capacity 201 is provided in the second semiconductor substrate 160*d* has been described as an example, a configuration in which the wiring capacity 201 is provided in the logic circuit substrate 130 can also be employed.

The fourth embodiment may be combined with the first embodiment to achieve a configuration in which the wiring capacity 201 is formed in the semiconductor substrate 100. The fourth embodiment may be combined with the third embodiment to achieve a configuration in which a plurality of MIM capacitive elements and the wiring capacity 201 are included in the second semiconductor substrate 160.

Configuration of Pixel in Fifth Embodiment

Figure 12:
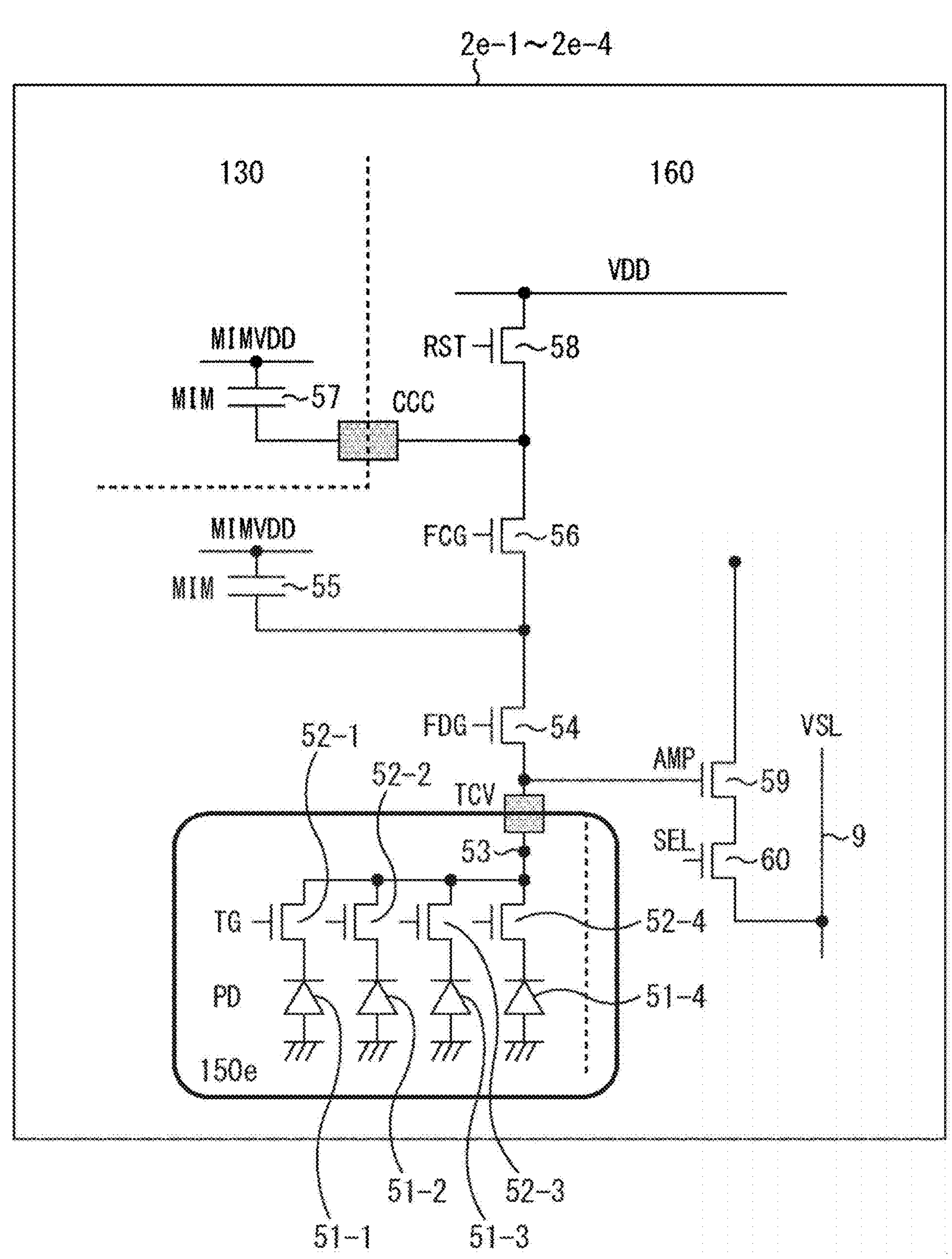
FIG. 12 is a diagram depicting examples of circuit configurations of pixels in a fifth embodiment.
Figure 13:
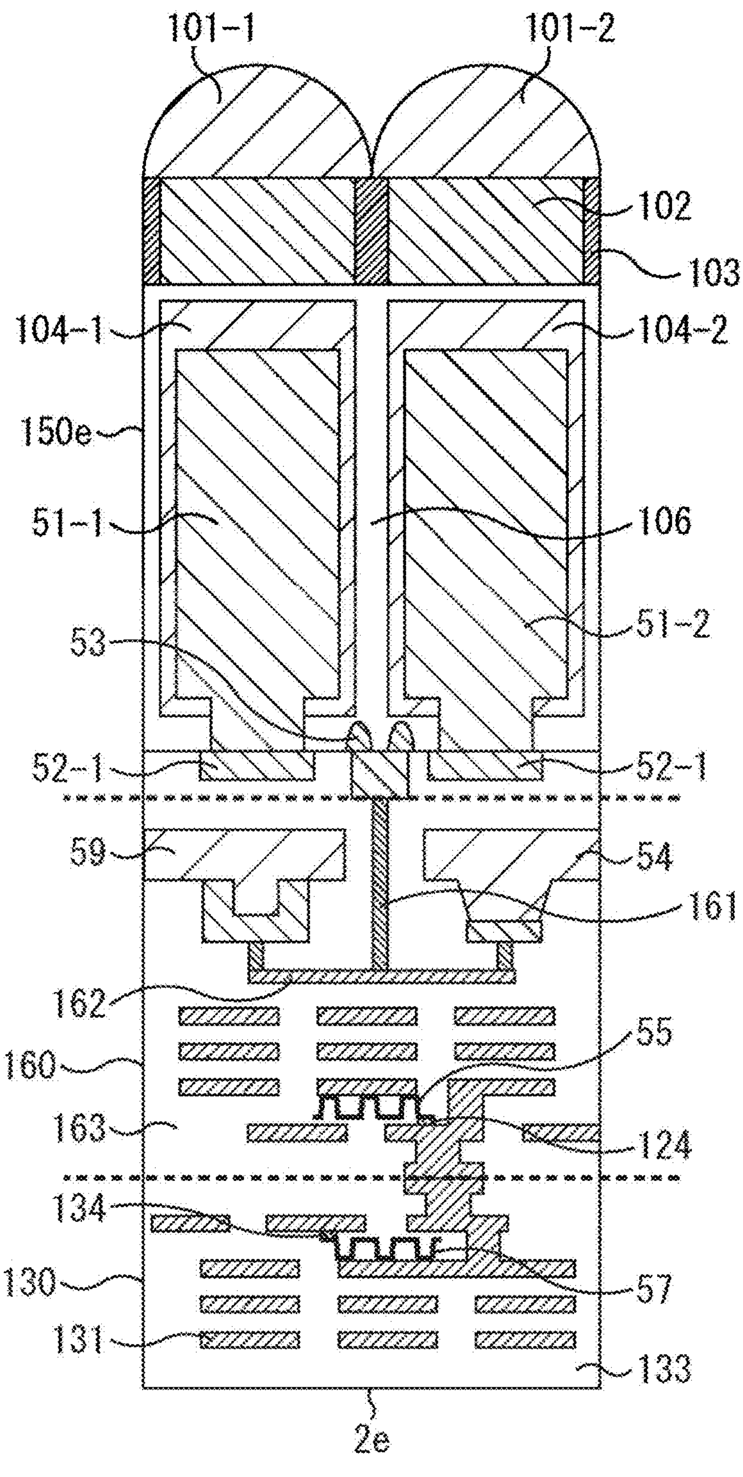
FIG. 13 is a diagram depicting examples of cross-sectional configurations of the pixels in the fifth embodiment.

FIG. 12 is a diagram depicting examples of circuit configurations of pixels 2*e* in a fifth embodiment. FIG. 13 is a diagram depicting examples of cross-sectional configurations of the pixels 2*e*. In the following description, the same parts as the pixel 2*b* in the second embodiment are denoted by the same reference symbols, and the descriptions thereof are appropriately omitted.

The pixel 2*e* in the fifth embodiment is different from the pixels 2 in the other embodiments in being configured such that the components from the FD section 53 to the selection transistor 60 are shared by the plurality of pixels. Here, a case where the components from the FD section 53 to the selection transistor 60 are shared by the four pixels 2*e* is described as an example.

Referring to the examples of the circuit configurations of the pixels 2*e* depicted in FIG. 12, a photoelectric conversion section 51-1, a transfer transistor 52-1, a photoelectric conversion section 51-2, a transfer transistor 52-2, a photoelectric conversion section 51-3, a transfer transistor 52-3, a photoelectric conversion section 51-4, and a transfer transistor 52-4 are formed in a first semiconductor substrate 150*e*. The components from the FD section 53 to the selection transistor 60 are connected to (shared by) those four photoelectric conversion sections 51-1 to 51-4.

The second semiconductor substrate 160 includes the first conversion efficiency switching transistor 54, the MIM capacitive element 55, the second conversion efficiency switching transistor 56, the reset transistor 58, the amplification transistor 59, and the selection transistor 60. The logic circuit substrate 130 includes the MIM capacitive element 57.

The components from the FD section 53 to the selection transistor 60 are configured to be shared by the four photoelectric conversion sections 51 (pixels 2*e*). FIG. 13 depicts the examples of the cross-sectional configurations of the two pixels 2*e* arranged side by side among the four pixels 2*e*. The FD section 53 is formed in the lower part of the first semiconductor substrate 150*e* of each of a pixel 2*e*-1 and a pixel 2*e*-2. The FD section 53 is connected to the first conversion efficiency switching transistor 54 and the amplification transistor 59 formed in the second semiconductor substrate 160, through the TCV 161 formed in the second semiconductor substrate 160.

In the lower central area of the first semiconductor substrate 150*e* of the pixel 2*e*-1 in FIG. 13, the transfer transistor 52-1 (gate thereof) configured to read out charges from the N-type semiconductor region 105 (photoelectric conversion section 51-1) is formed. Similarly, in the lower central area of the first semiconductor substrate 150*e* of the pixel 2*e*-2 in FIG. 13, the transfer transistor 52-2 (gate thereof) configured to read out charges from the N-type semiconductor region 105 (photoelectric conversion section 51-1) is formed.

The photoelectric conversion sections 51 and the transfer transistors 52 formed in the first semiconductor substrate 150*e* are formed for each of the pixels 2*e*, while the components from the first conversion efficiency switching transistor 54 to the selection transistor 60 (excluding the MIM capacitive element 57) formed in the second semiconductor substrate 160, and the MIM capacitive element 57 formed in the logic circuit substrate 130 are shared by the four pixels 2*e*.

It is also possible to apply a configuration like the pixel 2 of the first embodiment, in which the first semiconductor substrate 150*e* and the second semiconductor substrate 160 depicted in FIG. 13 are formed in the semiconductor substrate 100.

It is possible to apply the second to fourth embodiments to the configurations of the second semiconductor substrate 160 and the logic circuit substrate 130. In other words, it is also possible to implement the fifth embodiment in combination with the second to fourth embodiments. The example depicted in FIG. 12 and FIG. 13 is an example obtained by combining the second embodiment with the fifth embodiment.

The third embodiment may be combined with the fifth embodiment to achieve a configuration in which a plurality of MIM capacitive elements are formed in the second semiconductor substrate 160 and the logic circuit substrate 130. The fourth embodiment may be combined with the fifth embodiment such that the wiring capacity 201 is provided in the second semiconductor substrate 160 and the logic circuit substrate 130. The third to fifth embodiments may be combined to achieve a configuration in which a plurality of MIM capacitive elements and the wiring capacity 201 are included in the second semiconductor substrate 160 and the logic circuit substrate 130, and the plurality of MIM capacitive elements and the wiring capacity 201 are shared by the plurality of pixels 2.

In the pixel 2*e*, the three capacitors, namely, the FD section 53, the MIM capacitive element 55, and the MIM capacitive element 57, are included, and those capacitors are used to achieve the three conversion efficiencies and implement the three-time readout configuration, thereby making it possible to prevent the degradation of the S/N level differences at the junctions.

Since the pixel 2e is configured such that the components from the FD section 53 to the selection transistor 60 are shared by the plurality of pixels 2e, the pixel can be miniaturized.

Configuration of Pixel in Sixth Embodiment

Figure 14:
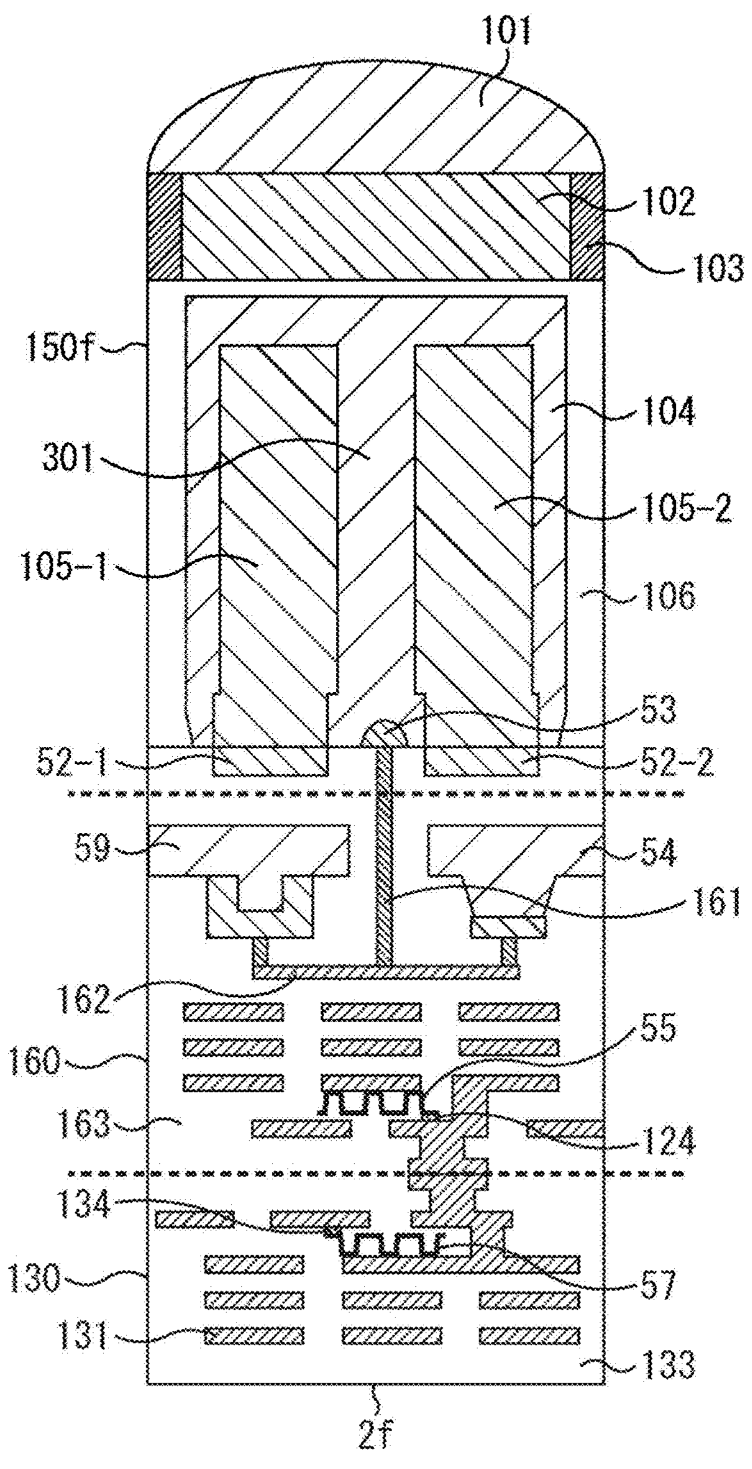
FIG. 14 is a diagram depicting an example of a cross-sectional configuration of a pixel in a sixth embodiment.
Figure 15:
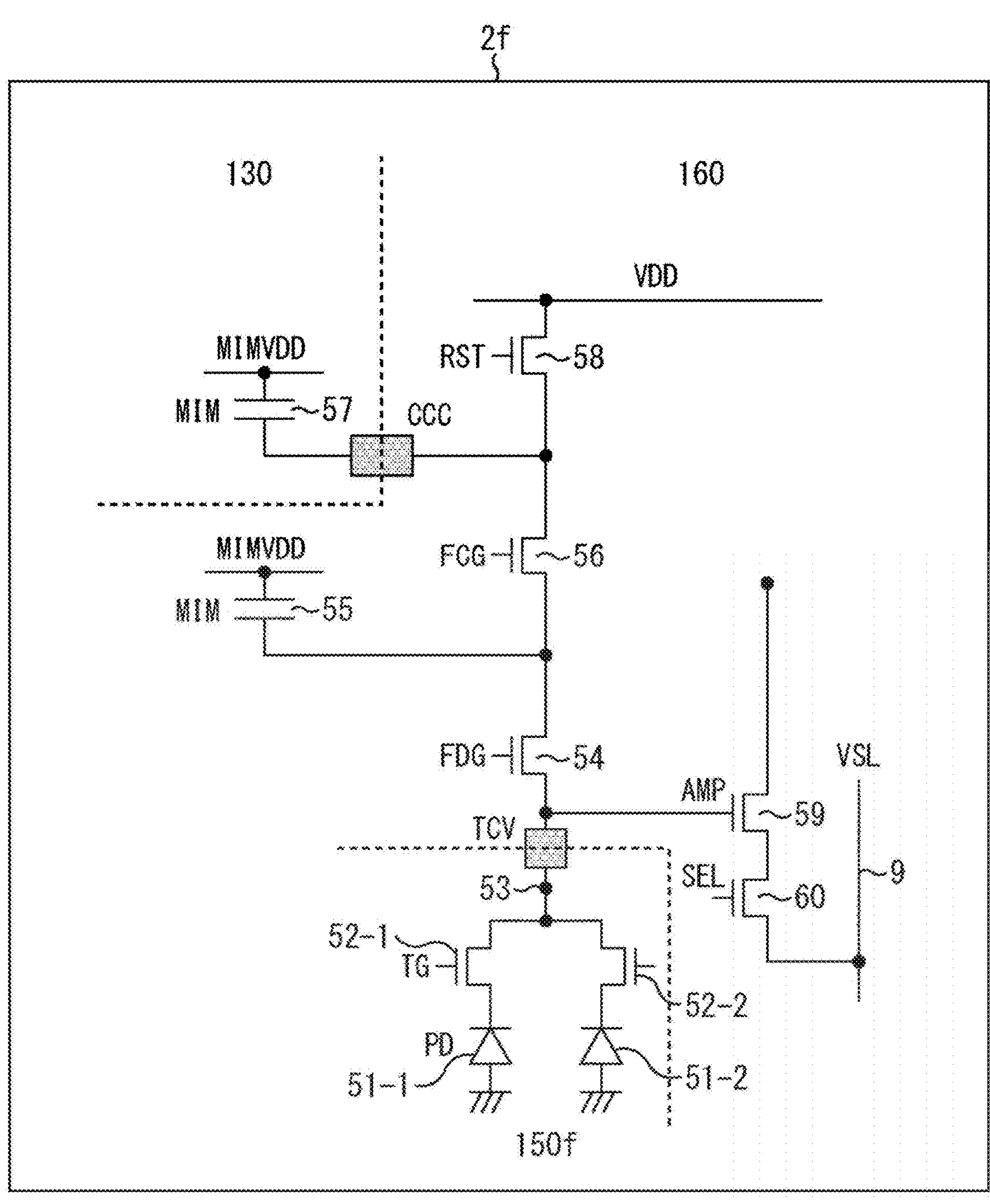
FIG. 15 is a diagram depicting an example of a circuit configuration of the pixel in the sixth embodiment.

FIG. 14 is a diagram depicting an example of a cross-sectional configuration of a pixel 2f in a sixth embodiment. FIG. 15 is a diagram depicting an example of a circuit configuration of the pixel 2f. In the following description, the same parts as the pixel 2b in the second embodiment are denoted by the same reference symbols, and the descriptions thereof are appropriately omitted.

The pixel 2f in the sixth embodiment is different from the pixels 2 in the other embodiments in being configured to include the plurality of photoelectric conversion sections 51 in the single pixel. Here, a case where the two photoelectric conversion sections 51 are included in the single pixel is described as an example. In a case where the region surrounded by the pixel separation section 106 is regarded as the single pixel 2f, the single pixel 2f includes two light-receiving sections.

In the pixel 2f depicted in FIG. 14, with a P-type semiconductor region 301 formed in a central portion of the N-type semiconductor region 105, the N-type semiconductor region 105 is divided into two regions, namely, an N-type semiconductor region 105-1 and an N-type semiconductor region 105-2. The N-type semiconductor region 105-1 and the N-type semiconductor region 105-2 each form the PD (photoelectric conversion section 51).

The transfer transistor 52-1 is provided for the N-type semiconductor region 105-1 (photoelectric conversion section 51-1), and the transfer transistor 52-2 is provided for the N-type semiconductor region 105-2 (photoelectric conversion section 51-2). The FD section 53 is formed between the transfer transistor 52-1 and the transfer transistor 52-2, and the FD section 53 is connected to the first conversion efficiency switching transistor 54 and the amplification transistor 59 formed in the second semiconductor substrate 160, through the TCV 161 formed in the second semiconductor substrate 160.

The respective configurations of the second semiconductor substrate 160 and the logic circuit substrate 130 can be similar to the respective configurations of the second semiconductor substrate 160 and the logic circuit substrate 130 depicted in FIG. 4.

Referring to the example of the circuit configuration of the pixel 2f depicted in FIG. 15, the photoelectric conversion section 51-1, the transfer transistor 52-1, the photoelectric conversion section 51-2, the transfer transistor 52-2, and the FD section 53 are formed in the first semiconductor substrate 150. The single pixel 2f includes the photoelectric conversion section 51-1 and the photoelectric conversion section 51-2, and the single FD section 53 is connected to the two photoelectric conversion sections 51-1 and 51-2.

The second semiconductor substrate 160 includes the first conversion efficiency switching transistor 54, the MIM capacitive element 55, the second conversion efficiency switching transistor 56, the reset transistor 58, the amplification transistor 59, and the selection transistor 60. The logic circuit substrate 130 includes the MIM capacitive element 57.

The components from the FD section 53 to the selection transistor 60 are configured to be shared by the two photoelectric conversion sections 51 included in the single pixel.

It is also possible to apply a configuration like the pixel 2 of the first embodiment, in which the first semiconductor substrate 150f and the second semiconductor substrate 160 depicted in FIG. 14 are formed in the semiconductor substrate 100.

It is possible to apply the second to fourth embodiments to the configurations of the second semiconductor substrate 160 and the logic circuit substrate 130. In other words, it is also possible to implement the sixth embodiment in combination with the second to fourth embodiments. The example depicted in FIG. 14 and FIG. 15 is an example obtained by combining the second embodiment with the sixth embodiment.

The third embodiment may be combined with the sixth embodiment to achieve a configuration in which a plurality of MIM capacitive elements are formed in the second semiconductor substrate 160 and the logic circuit substrate 130. The fourth embodiment may be combined with the sixth embodiment such that the wiring capacity 201 is provided in the second semiconductor substrate 160 and the logic circuit substrate 130. The third to sixth embodiments may be combined to achieve a configuration in which a plurality of MIM capacitive elements and the wiring capacity 201 are included in the second semiconductor substrate 160 and the logic circuit substrate 130, and the plurality of MIM capacitive elements and the wiring capacity 201 are shared by the plurality of pixels 2.

In the pixel 2f, the three capacitors, namely, the FD section 53, the MIM capacitive element 55, and the MIM capacitive element 57, are included, and those capacitors are used to achieve the three conversion efficiencies and implement the three-time readout configuration, thereby making it possible to prevent the degradation of the S/N level differences at the junctions.

The pixel 2f can be applied to phase difference detection pixels, for example.

Configuration of Pixel in Seventh Embodiment

Figure 16:
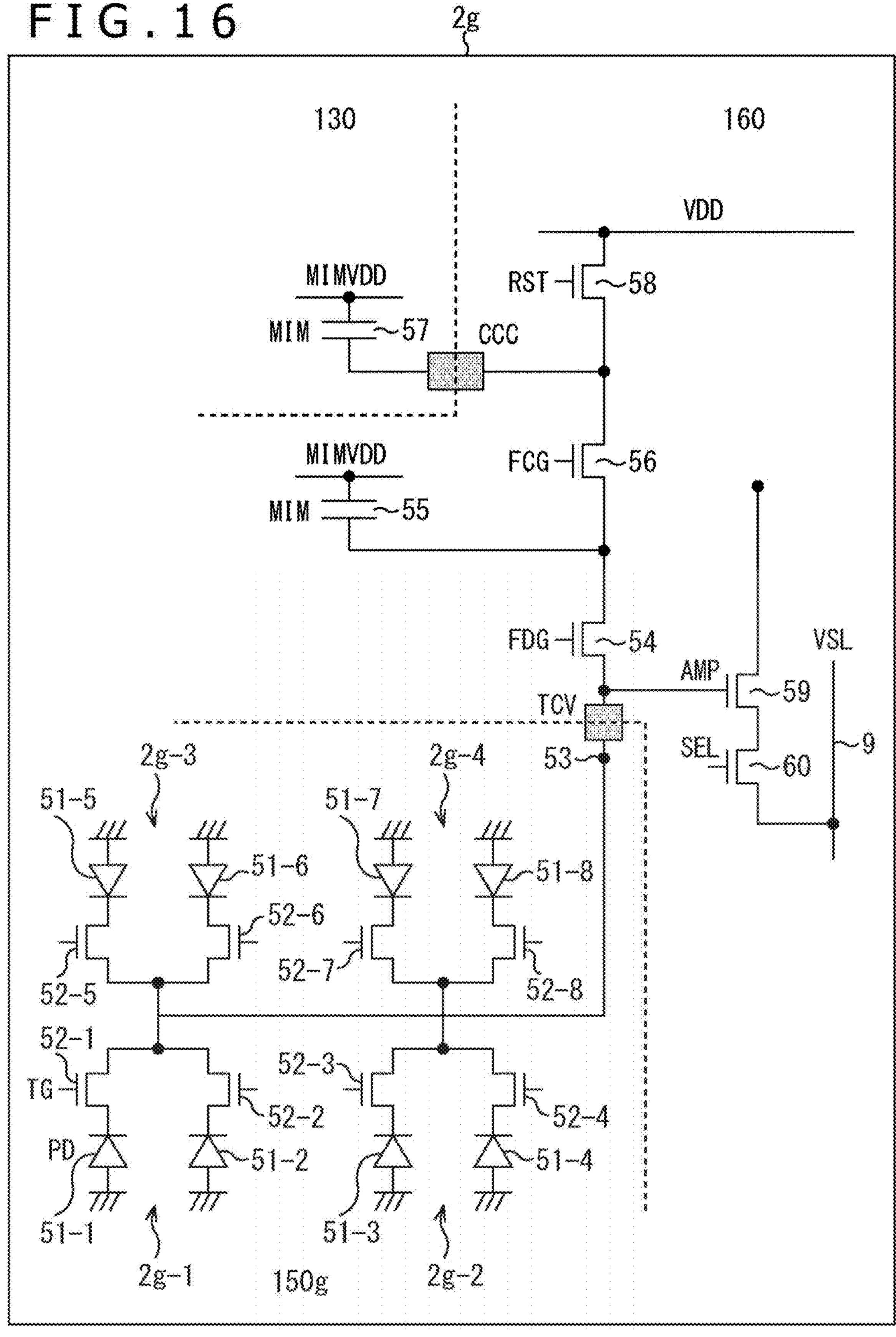
FIG. 16 is a diagram depicting an example of a circuit configuration of a pixel in a seventh embodiment.

FIG. 16 is a diagram depicting an example of a circuit configuration of a pixel 2g in a seventh embodiment. In the following description, the same parts as the pixel 2b in the second embodiment are denoted by the same reference symbols, and the descriptions thereof are appropriately omitted.

The pixel 2g in the seventh embodiment is different from the pixels 2 in the other embodiments in including the plurality of photoelectric conversion sections 51 in the single pixel. Here, a case where the two photoelectric conversion sections 51 are included in the single pixel is described as an example.

Further, the pixel 2g in the seventh embodiment is different from the pixels 2 in the other embodiments in being configured such that the components from the FD section 53 to the selection transistor 60 are shared by the plurality of pixels. Here, a case where the components from the FD section 53 to the selection transistor 60 are shared by the four pixels 2g is described as an example.

The single pixel 2g is configured such that, for example, like the pixel 2f depicted in FIG. 14, with the P-type semiconductor region 301 formed in the central portion of the N-type semiconductor region 105, the N-type semiconductor region 105 is divided into two regions, namely, the N-type semiconductor region 105-1 and the N-type semiconductor region 105-2. The N-type semiconductor region 105-1 and the N-type semiconductor region 105-2 each form the PD (photoelectric conversion section 51).

The transfer transistor 52-1 is provided for the photoelectric conversion section 51-1, and the transfer transistor 52-2 is provided for the photoelectric conversion section 51-2. The two photoelectric conversion sections 51 form a single pixel 2*g*-1. The transfer transistor 52-3 is provided for the photoelectric conversion section 51-3, and the transfer transistor 52-4 is provided for the photoelectric conversion section 51-4. The two photoelectric conversion sections 51 form a single pixel 2*g*-2.

A transfer transistor 52-5 is provided for a photoelectric conversion section 51-5, and a transfer transistor 52-6 is provided for a photoelectric conversion section 51-6. The two photoelectric conversion sections 51 form a single pixel 2*g*-3. A transfer transistor 52-7 is provided for a photoelectric conversion section 51-7, and a transfer transistor 52-8 is provided for a photoelectric conversion section 51-8. The two photoelectric conversion sections 51 form a single pixel 2*g*-4.

The respective configurations of the second semiconductor substrate 160 and the logic circuit substrate 130 can be similar to the respective configurations of the second semiconductor substrate 160 and the logic circuit substrate 130 depicted in FIG. 4.

Referring to the example of the circuit configuration of the pixel 2*g* depicted in FIG. 16, the photoelectric conversion sections 51-1 to 51-8, the transfer transistors 52-1 to 52-8, and the FD section 53 are formed in a first semiconductor substrate 150*g*. The single FD section 53 is connected to the eight photoelectric conversion sections 51, namely, the photoelectric conversion sections 51-1 to 51-8 (the four pixels 2*g*, namely, the pixels 2*g*-1 to 2*g*-4).

The second semiconductor substrate 160 includes the first conversion efficiency switching transistor 54, the MIM capacitive element 55, the second conversion efficiency switching transistor 56, the reset transistor 58, the amplification transistor 59, and the selection transistor 60. The logic circuit substrate 130 includes the MIM capacitive element 57.

The components from the FD section 53 to the selection transistor 60 are configured to be shared by the eight photoelectric conversion sections 51 included in the four pixels 2*g*.

It is also possible to apply a configuration like the pixel 2 of the first embodiment, in which the first semiconductor substrate 150*g* and the second semiconductor substrate 160 depicted in FIG. 16 are formed in the semiconductor substrate 100.

It is possible to apply the second to fourth embodiments to the configurations of the second semiconductor substrate 160 and the logic circuit substrate 130. In other words, it is also possible to implement the seventh embodiment in combination with the second to fourth embodiments. The example depicted in FIG. 16 is an example obtained by combining the second embodiment with the seventh embodiment.

The third embodiment may be combined with the seventh embodiment to achieve a configuration in which a plurality of MIM capacitive elements are formed in the second semiconductor substrate 160 and the logic circuit substrate 130. The fourth embodiment may be combined with the seventh embodiment such that the wiring capacity 201 is provided in the second semiconductor substrate 160 and the logic circuit substrate 130. The third to sixth embodiments may be combined to achieve a configuration in which a plurality of MIM capacitive elements and the wiring capacity 201 are included in the second semiconductor substrate 160 and the logic circuit substrate 130, and the plurality of MIM capacitive elements and the wiring capacity 201 are shared by the plurality of pixels 2.

In the pixel 2*g*, the three capacitors, namely, the FD section 53, the MIM capacitive element 55, and the MIM capacitive element 57, are included, and those capacitors are used to achieve the three conversion efficiencies and implement the three-time readout configuration, thereby making it possible to prevent the degradation of the S/N level differences at the junctions.

Since the pixel 2*g* is configured such that the components from the FD section 53 to the selection transistor 60 are shared by the plurality of pixels 2*g*, the pixel can be miniaturized.

The pixel 2*g* can be applied to phase difference detection pixels, for example.

Figure 17:
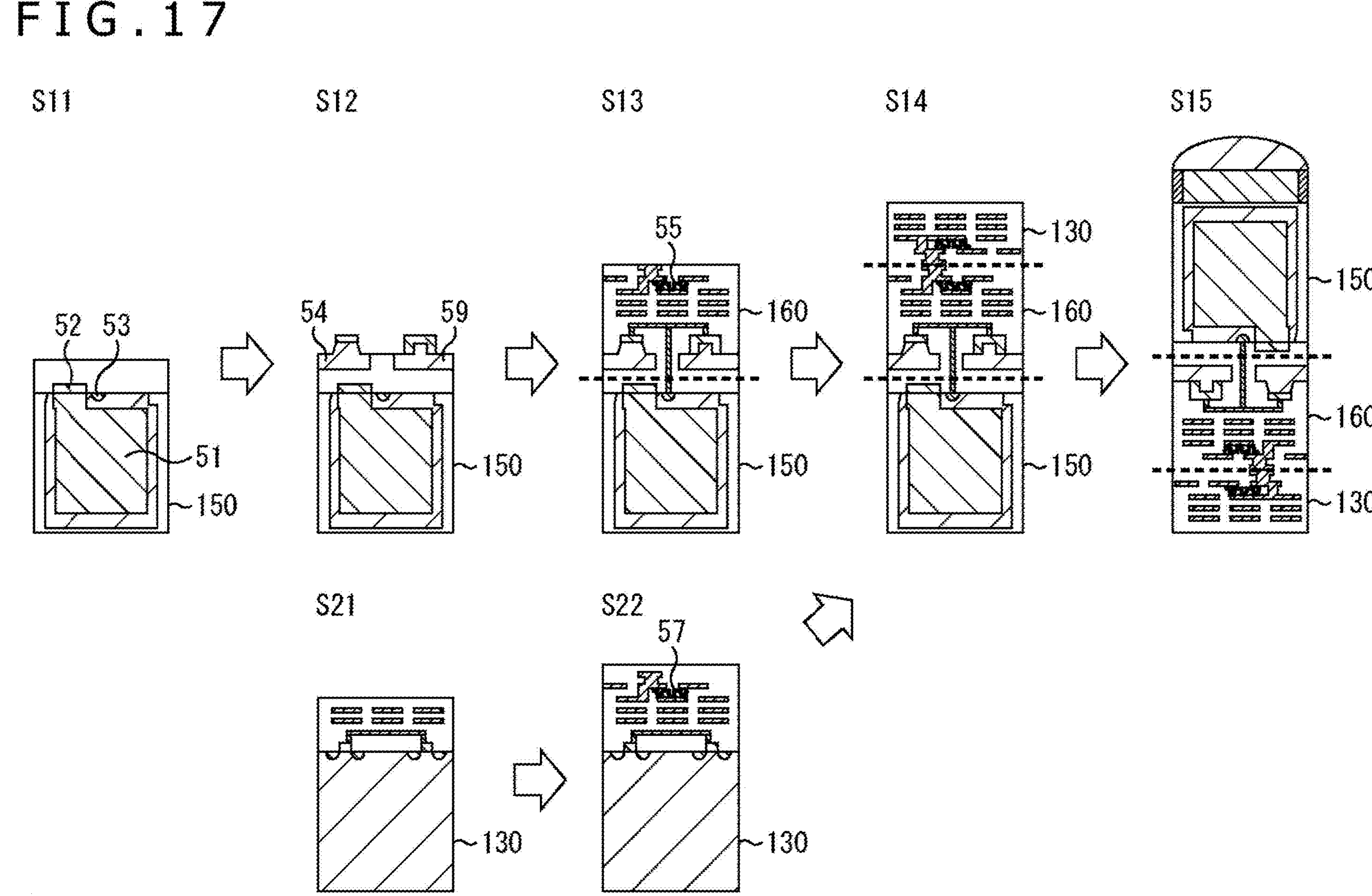
FIG. 17 is a diagram depicting manufacturing of the pixel.

Manufacturing of Pixel The manufacturing of the pixel 2 is described with reference to FIG. 17. In FIG. 17, a case where the pixel 2*b* depicted in FIG. 4 is manufactured is described as an example.

In Step S11, the respective components included in the first semiconductor substrate 150, such as the photoelectric conversion section 51, the transfer transistor 52, and the FD section 53, are formed in the first semiconductor substrate 150.

In Step S12, the transistors in the second semiconductor substrate 160 are formed. For example, the first conversion efficiency switching transistor 54 and the amplification transistor 59 are formed.

In Step S13, the wiring lines 122 and the MIM capacitive element 55 are further formed in the second semiconductor substrate 160. In a case where a plurality of MIM capacitive elements are formed in the second semiconductor substrate 160, in Step S13, the plurality of MIM capacitive elements are formed in the second semiconductor substrate 160. In a case where the wiring capacity 201 is formed in the second semiconductor substrate 160, in Step S13, the wiring capacity 201 is formed in the second semiconductor substrate 160.

While the first semiconductor substrate 150 and the second semiconductor substrate 160 are manufactured, in Step S21 and Step S22, processing on the logic circuit substrate 130 is executed. In Step S21, for example, the first conversion efficiency switching transistor 54, the wiring lines 131, and the like are formed in the logic circuit substrate 130.

In Step S22, the MIM capacitive element 57 is formed in the logic circuit substrate 130. In a case where a plurality of MIM capacitive elements are formed in the logic circuit substrate 130, in Step S22, the plurality of MIM capacitive elements are formed inside the logic circuit substrate 130. In a case where a wiring capacity is formed in the logic circuit substrate 130, in Step S22, the wiring capacity is formed in the logic circuit substrate 130. Note that, in a case where no MIM capacitive elements and wiring capacity are formed in the logic circuit substrate 130, in Step S22, the process of forming MIM capacitive elements or a wiring capacity can be skipped.

In Step S14, the logic circuit substrate 130 manufactured in Step S21 and Step S22 is stacked on the first semiconductor substrate 150 and the second semiconductor substrate 160 manufactured in Step S11 to Step S13. The logic circuit substrate 130 is bonded to the second semiconductor substrate 160. In Step S15, the on-chip lens 101, the CF 102, and the light-shielding film 103 are formed on the first semiconductor substrate 150. The pixel 2 depicted in FIG. 3 is manufactured in this way.

The pixels 2 in the other embodiments can also be manufactured basically using the same manufacturing process.

According to the present technology, by structuring pixels including a plurality of MIM capacitive elements, it is possible to significantly expand the dynamic range and gradually change the conversion efficiency, thereby enabling a reduction in the S/N level difference at the time of conversion efficiency switching.

Example of Application to Electronic Apparatus

The present technology is not limited to applications to imaging elements. That is, the present technology can be applied to general electronic apparatuses using imaging elements in image capturing units (photoelectric conversion units), for example, imaging devices such as digital still cameras and video cameras, portable terminal devices having an imaging function, and copy machines using imaging elements in image reading units. The imaging element may be in the form of a one-chip or in a modular form in which an image pickup unit and a signal processing unit or an optical system are packaged together to provide an imaging function.

Figure 18:
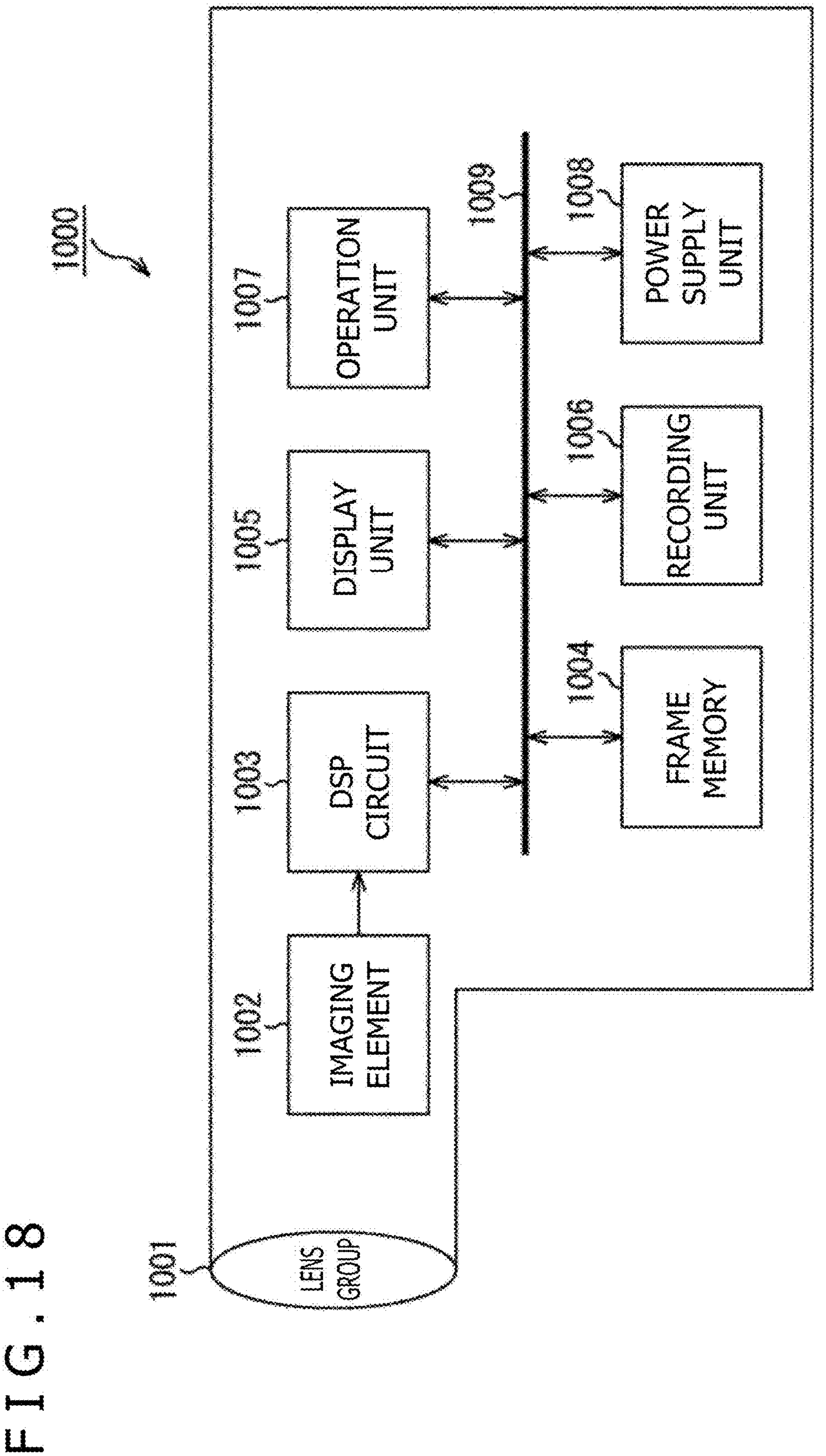
FIG. 18 is a diagram depicting an example of an electronic apparatus.

FIG. 18 is a block diagram depicting an example of a configuration of an imaging device that serves as an electronic apparatus to which the present technology is applied.

An imaging element 1000 of FIG. 18 includes an optical unit 1001 including a lens group or the like, an imaging element (imaging device) 1002 employing the configuration of the imaging device 1 of FIG. 1, and a DSP (Digital Signal Processor) circuit 1003 that is a camera signal processing circuit. Further, the imaging element 1000 includes a frame memory 1004, a display unit 1005, a recording unit 1006, an operation unit 1007, and a power supply unit 1008. The DSP circuit 1003, the frame memory 1004, the display unit 1005, the recording unit 1006, the operation unit 1007, and the power supply unit 1008 are connected to each other via a bus line 1009.

The optical unit 1001 takes incident light (image light) from an object and forms an image on the imaging plane of the imaging element 1002. The imaging element 1002 converts the amount of incident light imaged on the imaging plane by the optical unit 1001 to an electric signal on a pixel-by-pixel basis and outputs the electric signal as a pixel signal. As this imaging element 1002, the imaging device 1 of FIG. 1 can be used.

The display unit 1005 includes, for example, a flat panel display such as an LCD (Liquid Crystal Display) or an organic EL (Electro Luminescence) display and displays moving images or still images taken by the imaging element 1002. The recording unit 1006 records moving images or still images taken by the imaging element 1002 on a recording medium such as a hard disk or a semiconductor memory.

The operation unit 1007 issues, under the operation by the user, operation instructions for various functions of the imaging element 1000. The power supply unit 1008 appropriately supplies, to the DSP circuit 1003, the frame memory 1004, the display unit 1005, the recording unit 1006, and the operation unit 1007, various types of power supply as operating power supply for these supply targets.

Example of Application to Endoscopic Surgery System

The technology according to the present disclosure (present technology) can be applied to various products. For example, the technology according to the present disclosure may be applied to endoscopic surgery systems.

Figure 19:
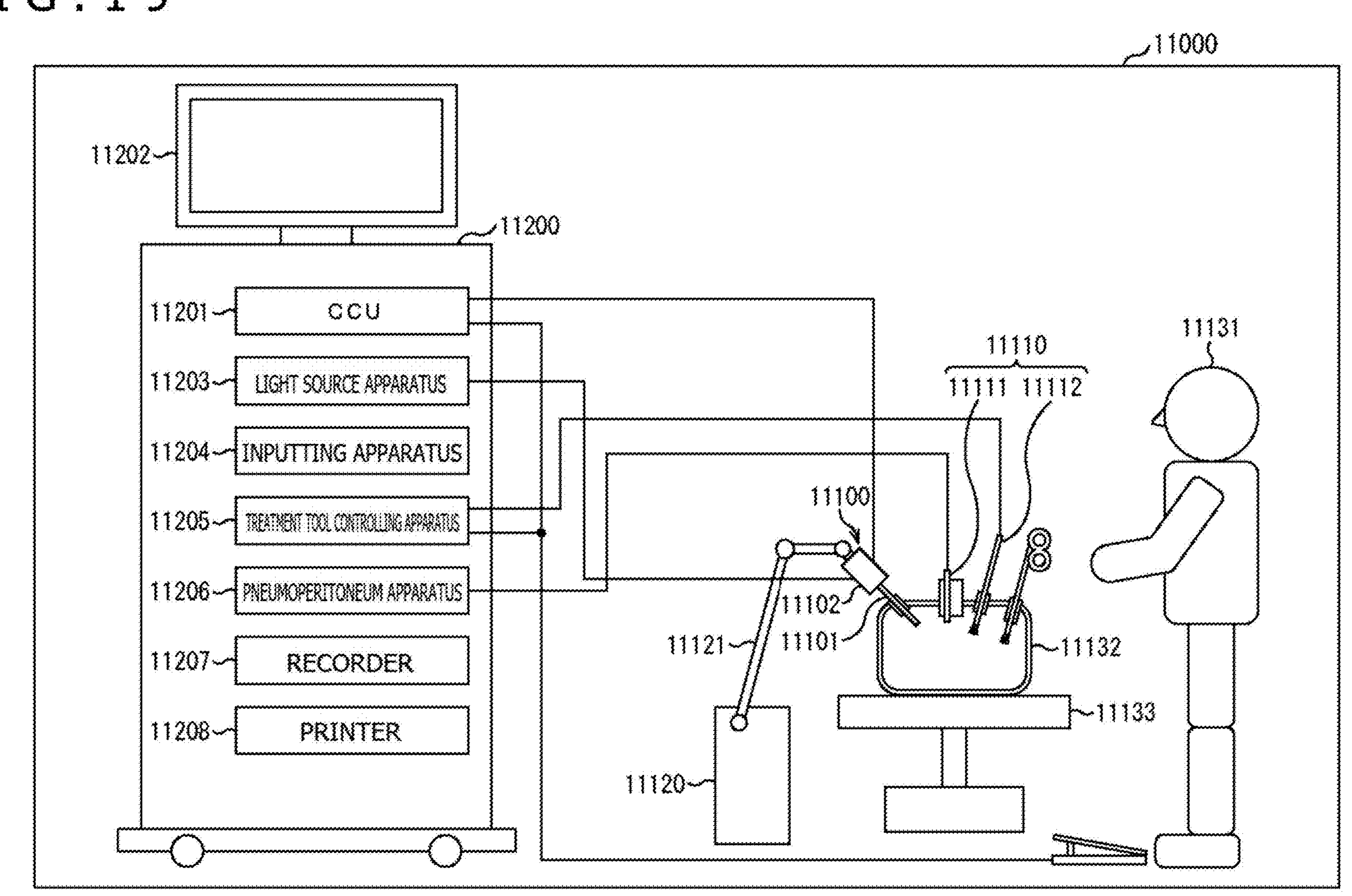
FIG. 19 is a view depicting an example of a schematic configuration of an endoscopic surgery system.

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the imaging elements of the camera head 11102 are controlled in synchronism with the irradiation timings. Then images individually corresponding to the R, G and B colors can be also picked up time-divisionally. According to this method, a color image can be obtained even if color filters are not provided for the imaging element.

Further, the light source apparatus 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 20:
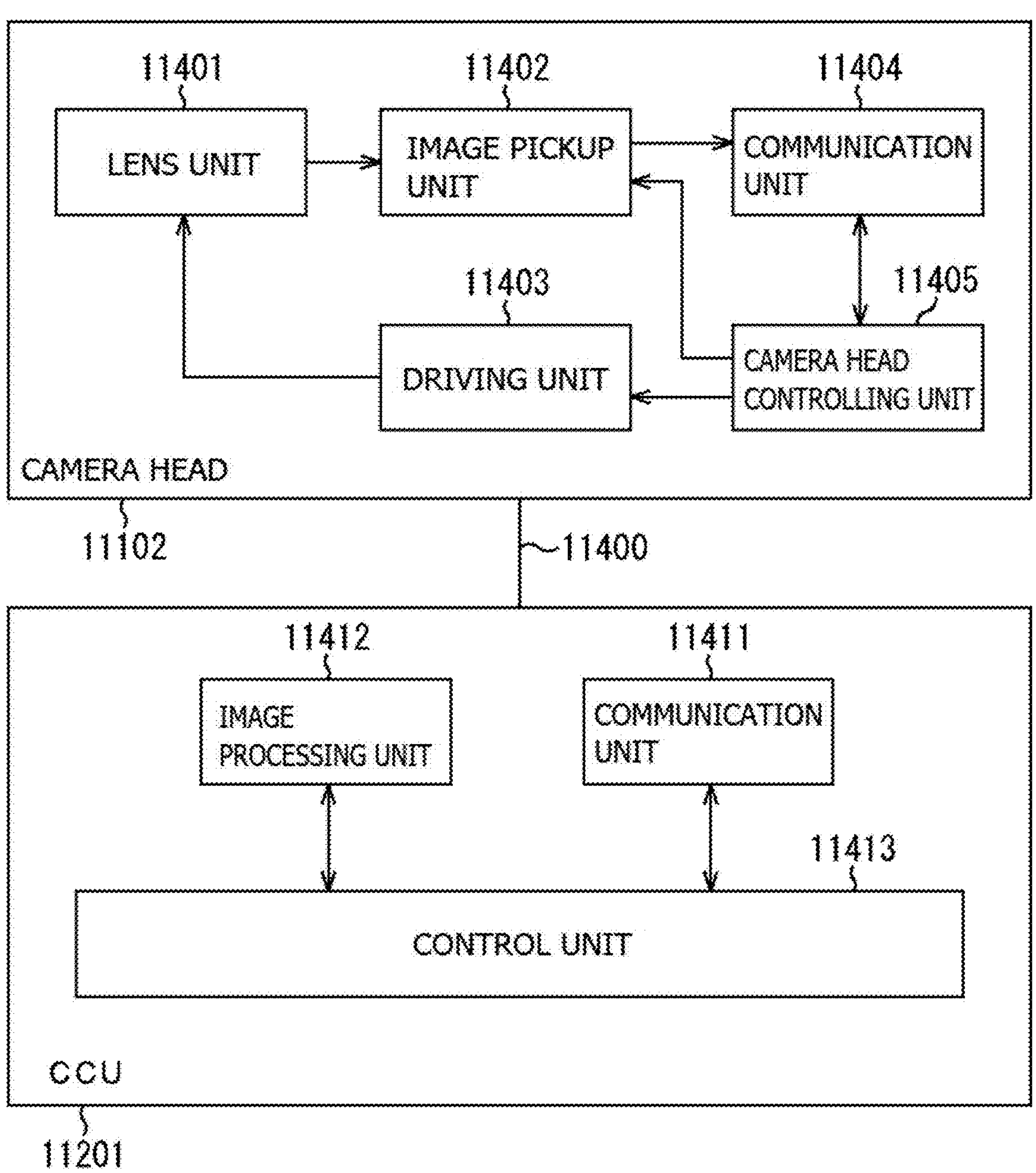
FIG. 20 is a block diagram depicting an example of a functional configuration of a camera head and a camera control unit (CCU).

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of imaging elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the imaging elements, and the image signals may be synthesized to obtain a color image. The image pickup unit 11402 may also be configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual imaging elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the present specification, a system represents an entire device including a plurality of devices.

Note that, the effects described herein are merely examples and are not limited, and other effects may be provided.

Note that embodiments of the present technology are not limited to the embodiments described above, and various modifications can be made without departing from the gist of the present technology.

Note that the present technology can also take the following configurations.

(1)

An imaging element including:

a photoelectric conversion section configured to convert light into a charge;

three or more accumulation sections configured to temporarily accumulate the charge;

a transfer section configured to transfer the charge from the photoelectric conversion section to the accumulation sections; and a conversion efficiency switching section configured to control a conduction state between the accumulation sections, in which at least two accumulation sections of the three or more accumulation sections are each a capacitive element, and the three or more accumulation sections accumulate an overflow charge from the photoelectric conversion section.

(2)

The imaging element according to (1) above, in which the capacitive elements are each an MIM (Metal-Insulator-Metal) capacitive element.

(3)

The imaging element according to (1) or (2) above, in which a wiring capacity is included as each of the accumulation sections.

(4)

The imaging element according to any one of (1) to (3) above, further including:

a through trench for separating pixels from each other.

(5)

The imaging element according to any one of (1) to (4) above, in which the photoelectric conversion section is provided in a first semiconductor substrate, the capacitive element and the conversion efficiency switching section are provided in a second semiconductor substrate, and the first semiconductor substrate and the second semiconductor substrate are stacked on top of another.

(6)

The imaging element according to (5) above, in which the second semiconductor substrate is provided with a plurality of the capacitive elements.

(7)

The imaging element according to (5) above, in which a logic circuit substrate having a logic circuit formed thereon is stacked on the second semiconductor substrate, and the capacitive element is provided in the logic circuit substrate.

(8)

The imaging element according to any one of (1) to (7) above, in which the capacitive element and the conversion efficiency switching section are shared by a plurality of the photoelectric conversion sections.

(9)

The imaging element according to any one of (1) to (7) above, in which two of the photoelectric conversion sections are included in a single pixel, and the capacitive element and the conversion efficiency switching section are shared by the two of the photoelectric conversion sections.

(10)

The imaging element according to any one of (1) to (7) above, in which two of the photoelectric conversion sections are included in a single pixel, and the capacitive element and the conversion efficiency switching section are shared by four pixels.

(11)

The imaging element according to any one of (2) to (10) above, in which the three or more accumulation sections each include an FD (Floating Diffusion) and two of the MIM capacitive elements, and the conversion efficiency switching section is controlled to perform charge readout from the photoelectric conversion section with each of high conversion efficiency, medium conversion efficiency, and low conversion efficiency.

(12)

An imaging element including:

a photoelectric conversion section;

a transfer transistor connected to the photoelectric conversion section;

a floating diffusion connected to the transfer transistor;

a first conversion efficiency switching transistor connected to the floating diffusion;

a second conversion efficiency switching transistor connected to the first conversion efficiency switching transistor;

a reset transistor connected to the second conversion efficiency switching transistor;

a first accumulation section; and a second accumulation section, in which the first accumulation section is connected between the first conversion efficiency switching transistor and the second conversion efficiency switching transistor, the second accumulation section is connected between the second conversion efficiency switching transistor and the reset transistor, and the floating diffusion accumulates a charge that has overflowed from the photoelectric conversion section.

(13)

The imaging element according to (12) above, in which the charge that has overflowed from the photoelectric conversion section is accumulated in the floating diffusion and the first accumulation section.

(14)

The imaging element according to (12) or (13) above, in which the charge that has overflowed from the photoelectric conversion section is accumulated in the floating diffusion, the first accumulation section, and the second accumulation section.

(15)

The imaging element according to any one of (12) to (14) above, in which capacitance of the first accumulation section and capacitance of the second accumulation section are each larger than capacitance of the floating diffusion.

(16)

The imaging element according to any one of (12) to (15) above, further including:

an amplification transistor connected to the floating diffusion; and a selection transistor connected to the amplification transistor.

(17)

An electronic apparatus including:

an imaging element including a photoelectric conversion section configured to convert light into a charge, three or more accumulation sections configured to temporarily accumulate the charge, a transfer section configured to transfer the charge from the photoelectric conversion section to the accumulation sections, a conversion efficiency switching section configured to control a conduction state between the accumulation sections, at least two accumulation sections of the three or more accumulation sections are each a capacitive element, and the three or more accumulation sections each accumulating an overflow charge from the photoelectric conversion section; and a processing unit configured to process a signal from the imaging element.

REFERENCE SIGNS LIST

1: Imaging device
2: Pixel
3: Pixel array section
4: Vertical drive circuit
5: Column signal processing circuit
6: Horizontal drive circuit
7: Output circuit
8: Control circuit
9: Vertical signal line
10: Pixel drive line
11: Horizontal signal line
13: Input/output terminal
31: Selection transistor
51: Photoelectric conversion section
52: Transfer transistor
53: FD section
54: First conversion efficiency switching transistor
55: MIM capacitive element
56: Second conversion efficiency switching transistor
57: MIM capacitive element
58: Reset transistor
59: Amplification transistor
60: Selection transistor
100: Semiconductor substrate
101: On-chip lens
103: Light-shielding film
104: P-type semiconductor region
105: N-type semiconductor region
106: Pixel separation section
120: Wiring layer
121: Local wiring line
122: Wiring line
123: Insulating layer
124: Via
130: Logic circuit substrate
131: Wiring line

133: Insulating layer
150: First semiconductor substrate
160: Second semiconductor substrate
161: Wiring line
162: Wiring line
163: Insulating layer
201: Wiring capacity
202: Third conversion efficiency switching transistor
301: P-type semiconductor region

What is claimed is:

1. An imaging element, comprising:
a photoelectric conversion section configured to convert light into a charge;
three or more accumulation sections configured to temporarily accumulate the charge;
a transfer section configured to transfer the charge from the photoelectric conversion section to the accumulation sections; and
a conversion efficiency switching section configured to control a conduction state between the accumulation sections,
wherein at least two accumulation sections of the three or more accumulation sections are each a capacitive element, and
the three or more accumulation sections accumulate an overflow charge from the photoelectric conversion section.

2. The imaging element according to claim 1,
wherein the capacitive elements are each an MIM (Metal-Insulator-Metal) capacitive element.

3. The imaging element according to claim 1,
wherein a wiring capacity is included as each of the accumulation sections.

4. The imaging element according to claim 1, further comprising:
a through trench for separating pixels from each other.

5. The imaging element according to claim 1,
wherein the photoelectric conversion section is provided in a first semiconductor substrate,
the capacitive element and the conversion efficiency switching section are provided in a second semiconductor substrate, and
the first semiconductor substrate and the second semiconductor substrate are stacked on top of another.

6. The imaging element according to claim 5,
wherein the second semiconductor substrate is provided with a plurality of the capacitive elements.

7. The imaging element according to claim 5,
wherein a logic circuit substrate having a logic circuit formed thereon is stacked on the second semiconductor substrate, and
the capacitive element is provided in the logic circuit substrate.

8. The imaging element according to claim 1,
wherein the capacitive element and the conversion efficiency switching section are shared by a plurality of the photoelectric conversion sections.

9. The imaging element according to claim 1,
wherein two of the photoelectric conversion sections are included in a single pixel, and
the capacitive element and the conversion efficiency switching section are shared by the two of the photoelectric conversion sections.

10. The imaging element according to claim 1,
wherein two of the photoelectric conversion sections are included in a single pixel, and
the capacitive element and the conversion efficiency switching section are shared by four pixels.

11. The imaging element according to claim 2,
wherein the three or more accumulation sections each include an FD (Floating Diffusion) and two of the MIM capacitive elements, and
the conversion efficiency switching section is controlled to perform charge readout from the photoelectric conversion section with each of high conversion efficiency, medium conversion efficiency, and low conversion efficiency.

12. An imaging element, comprising:
a photoelectric conversion section;
a transfer transistor connected to the photoelectric conversion section;
a floating diffusion connected to the transfer transistor;
a first conversion efficiency switching transistor connected to the floating diffusion;
a second conversion efficiency switching transistor connected to the first conversion efficiency switching transistor;
a reset transistor connected to the second conversion efficiency switching transistor;
a first accumulation section; and
a second accumulation section,
wherein the first accumulation section is connected between the first conversion efficiency switching transistor and the second conversion efficiency switching transistor,
the second accumulation section is connected between the second conversion efficiency switching transistor and the reset transistor, and
the floating diffusion accumulates a charge that has overflowed from the photoelectric conversion section.

13. The imaging element according to claim 12,
wherein the charge that has overflowed from the photoelectric conversion section is accumulated in the floating diffusion and the first accumulation section.

14. The imaging element according to claim 12,
wherein the charge that has overflowed from the photoelectric conversion section is accumulated in the floating diffusion, the first accumulation section, and the second accumulation section.

15. The imaging element according to claim 12,
wherein capacitance of the first accumulation section and capacitance of the second accumulation section are each larger than capacitance of the floating diffusion.

16. The imaging element according to claim 12, further comprising:
an amplification transistor connected to the floating diffusion; and
a selection transistor connected to the amplification transistor.

17. An electronic apparatus, comprising:
an imaging element including
a photoelectric conversion section configured to convert light into a charge,
three or more accumulation sections configured to temporarily accumulate the charge,
a transfer section configured to transfer the charge from the photoelectric conversion section to the accumulation sections,
a conversion efficiency switching section configured to control a conduction state between the accumulation sections, at least two accumulation sections of the three or more accumulation sections are each a capacitive element, and the three or more accumulation sections each accumulating an overflow charge from the photoelectric conversion section; and a processing unit configured to process a signal from the imaging element.

* * * * *